United States Patent
Kaul

(10) Patent No.: US 7,574,338 B1
(45) Date of Patent: Aug. 11, 2009

(54) FINITE-DIFFERENCE SIMULATION AND VISUALIZATION OF ELASTODYNAMICS IN TIME-EVOLVING GENERALIZED CURVILINEAR COORDINATES

(75) Inventor: Upender K. Kaul, Fremont, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 191 days.

(21) Appl. No.: 11/340,002

(22) Filed: Jan. 19, 2006

Related U.S. Application Data

(60) Provisional application No. 60/647,720, filed on Jan. 19, 2005.

(51) Int. Cl.
*G06F 9/455* (2006.01)
(52) U.S. Cl. .............. 703/7; 703/6; 703/2; 702/13; 702/14; 702/66; 73/593; 73/787; 324/239; 324/240
(58) Field of Classification Search ............ 703/6, 703/7, 2; 702/13, 14, 66; 422/194; 428/411.1; 347/19; 73/593, 788; 324/239, 240; 318/254
See application file for complete search history.

(56) References Cited

U.S. PATENT DOCUMENTS

| | | | |
|---|---|---|---|
| 6,125,330 A * | 9/2000 | Robertson et al. ............. | 702/14 |
| 6,526,829 B1 * | 3/2003 | Lysen et al. ................... | 73/593 |
| 7,231,329 B1 | 6/2007 | Kaul | |
| 2002/0099510 A1 * | 7/2002 | Namiki ........................ | 702/66 |
| 2003/0106378 A1 * | 6/2003 | Giannakopoulos et al. .... | 73/788 |
| 2004/0056654 A1 * | 3/2004 | Goldfine et al. ............. | 324/239 |
| 2004/0107081 A1 * | 6/2004 | Miyori et al. .................. | 703/6 |
| 2004/0219079 A1 * | 11/2004 | Hagen et al. ................ | 422/194 |
| 2005/0021234 A1 * | 1/2005 | Han ............................. | 702/13 |
| 2005/0127908 A1 * | 6/2005 | Schlicker et al. ............ | 324/240 |
| 2005/0159936 A1 * | 7/2005 | Rees et al. ..................... | 703/6 |
| 2005/0243117 A1 * | 11/2005 | Yu ............................... | 347/19 |
| 2006/0029807 A1 * | 2/2006 | Peck ....................... | 428/411.1 |
| 2006/0261765 A1 * | 11/2006 | Prasanna .................... | 318/254 |

OTHER PUBLICATIONS

Lee et al., "The enhancement of al elliptic grid using appropriate control functions", Applied Mathematics and computation, 2003.*

(Continued)

*Primary Examiner*—Paul L Rodriguez
*Assistant Examiner*—Kandasamy Thangavelu
(74) *Attorney, Agent, or Firm*—John F. Schipper; Robert M. Padilla

(57) ABSTRACT

Modeling and simulation of free and forced structural vibrations is essential to an overall structural health monitoring capability. In the various embodiments, a first principles finite-difference approach is adopted in modeling a structural subsystem such as a mechanical gear by solving elastodynamic equations in generalized curvilinear coordinates. Such a capability to generate a dynamic structural response is widely applicable in a variety of structural health monitoring systems. This capability (1) will lead to an understanding of the dynamic behavior of a structural system and hence its improved design, (2) will generate a sufficiently large space of normal and damage solutions that can be used by machine learning algorithms to detect anomalous system behavior and achieve a system design optimization and (3) will lead to an optimal sensor placement strategy, based on the identification of local stress maxima all over the domain.

24 Claims, 28 Drawing Sheets

OTHER PUBLICATIONS

Jameson, "Essential elements of computational algorithms for aerodynamic analysis and design", National Aeronautics and Space Administration, Dec. 1997.*

Ramjikamakoti, "Computational aeroelasticity using pressure based solver", University of Florida, 2004.*

Chandrasekhar, Hydrodynamic and Hydromagnetic Stability, 1981, 80-83, Dover Publications, Inc., New York.

Kaul, New Boundary Constraints for Elliptic Systems Used in Grid Generation Problems, Journal of Computational Physics, 2003, 476-492, 189, Elsevier Science B.V.

Kaul, Structural Vibration Signature Modeling, Industry Day, NASA Ames Research Center, 2004.

Kaul, Fiddle: A Computer Code for Finite Difference Development of Linear Elasticity in Generalized Curvilinear Coordinates, Jan. 2005, NASA/TM-2005-213450.

Kaul, Finite Difference Modeling and Simulation of Idealized Gear Vibrations, 5th Int. Conf. Structural Health and Monitoring, Sep. 2005, Stanford University, California.

Kaul, et al., Full Viscous Modeling in Generalized Coordinates of Heat Conducting Flows in Rotating Systems, AIAA J. Thermophysics and Heat Transfer, 1996, 621-626, 10-4.

Kaul, et al., Automated Gear Teeth Grid Generation via Solution of Elliptic Pdes, SIAM Conference on Geometric Design and Computing, Nov. 5-8, 2001, Sacramento, CA.

Kaul, et al., Machine Learning for Detecting and Locating Damage in a Rotating Gear, SAE Transactions, 2005, Paper 2005-013371, SAE International.

Love, A Treatise on the Mathematical Theory of Elasticity, Cambridge at the University Press, 146-148, 1934.

Madariaga, Dynamics of an expanding circular fault, Bulletin of the Seismological Society of America, 1976, 639-665, 66-3.

Oza, et al., Machine Learning for Fault Detection in a Rotating Gear, SAE World Aerospace Conference, Oct. 3-6, 2005, Paper 05WAC-118, Dallas, Texas.

Timoshenko, et al., Theory of Elasticity, 1934, 80-82 and 388-390, McGraw-Hill, Inc.

Virieux, SH-Wave Propagation in Heterogeneous Media: Velocity-Stress Finite-Difference Method, J. Geophysics, Nov. 1984, 1933-1957, 49-11.

* cited by examiner

FINITE-DIFFERENCE SIMULATION AND VISUALIZATION OF ELASTODYNAMICS IN TIME-EVOLVING GENERALIZED CURVILINEAR COORDINATES

RELATED APPLICATIONS

This application claims priority to U.S. Provisional Patent Application No. 60/647,720, entitled "Finite-Difference Simulation and Visualization of Elastodynamics in Time-Evolving Generalized Curvilinear Coordinates," by Upender Kaul, and filed on Jan. 19, 2005, which is hereby incorporated by reference in its entirety. The invention unifies an earlier invention, U.S. patent application Ser. No. 10/706,478, entitled "Enhanced Elliptic Grid Generation," by Upender Kaul, and filed on Nov. 7, 2003, currently issued as U.S. Pat. No. 7,231,329 on May 23, 2007, which claims priority to U.S. Provisional Patent Application No. 60/425,750, entitled "Elimination of Parameter Input Requirement for Elliptic Grid Generation Methods in Engineering," by Upender Kaul, and filed on Nov. 7, 2002 (both of which are hereby incorporated by reference in their entirety), and a new solution method based on finite differences to simulate structural dynamic phenomena over time-varying grids in generalized curvilinear coordinates.

STATEMENT OF GOVERNMENT INTEREST

The invention described herein was made by an employee of the United States Government and may be manufactured and used by or for the Government of the United States of America for governmental purposes without payment of any royalties thereon or therefor.

TECHNICAL FIELD OF THE INVENTION

The present invention relates generally to numerical simulation of dynamic stresses, and in particular, to generalized curvilinear coordinate formulation for finite-difference prediction of stresses in elastic bodies under rotation.

BACKGROUND OF THE INVENTION

Conventional simulation methods to solve structural dynamics problems are in the domain of finite element technology where the problem is solved in the modal domain and then the results are mapped into the time domain by appropriate transformations.

Limitations of the prior art have been in the difficulty in deriving new three-dimensional elements for different applications of interest and the lack of ease in obtaining the temporal solution directly from the solution of governing elastodynamic pdes.

The need to know the state of a structural system during its operation in terms of the physical output variables such as stresses and the geometric configuration of the system itself is essential for monitoring the system health. Such systems can be tested, prior to launching them in their operational domain, in a laboratory or through relatively inexpensive computational simulations.

Such systems when subjected to space and time varying loads during their operation can throw the system into unsafe states from the system's health perspective. It is therefore essential to have a prior knowledge of such system states before the systems are commissioned.

For the reasons stated above, and for other reasons stated below which will become apparent to those skilled in the art upon reading and understanding the present specification, there is a need in the art for alternative modeling and simulation methods for structural systems.

SUMMARY OF THE INVENTION

Modeling and simulation of free and forced structural vibrations is an essential element of an overall health monitoring capability for any structural system such as a rotorcraft or any aerospace vehicle. In the various embodiments, a first principles finite-difference approach is adopted in modeling a structural subsystem such as a mechanical gear by solving elastodynamic equations in generalized curvilinear coordinates. While any structural subsystem can similarly be modeled, the various embodiments are described with reference to an annular disk, a thin solid disk and an idealized gear. Such a capability to generate a dynamic structural response has a wide applicability in a variety of structural health monitoring systems. Not only does this capability serve as a tool for understanding the dynamic behavior of a structural system and hence its improved design, but it also serves as a means by which a sufficiently large space of normal and damage solutions can be generated that can be used by a variety of machine learning algorithms to detect anomalous dynamic structural behavior of the system or to achieve a multi-function design optimization of the given structural system. This capability will also aid in defining an optimal sensor placement configuration over structural subsystems for health monitoring, by identifying areas of local maxima of mechanical or thermal stress or loading. Such a capability to generate vibration response from a subsystem will also be useful in the area of vibration energy harvesting. Also, the methodology can be used to track stress wave propagation in a structural system which is useful in the health monitoring of such a system.

The methodology is based on physics-based first principles, governing elastodynamics in the space-time domain. This innovation provides a powerful and yet simple methodology to compute structural dynamic variables of interest such as stresses over an entire grid mapped over or inside a given body of interest directly in the time domain. The grid can be allowed to deform in time as the solution evolves. The simulation (deforming grids and stresses) can be visualized as the solution proceeds in time; the simulation can be suspended at any point in time based on the visualization of the state of the system and the simulation can be resumed or terminated altogether according as the evolving solution proceeds within the expectation bounds dictated by physics. The attractiveness of the innovation lies in the intuitiveness of the approach where the physical variables such as stresses as well as the deforming body can be visualized directly in space and time, as the simulation proceeds.

This simulation technology incorporates an innovative elliptic grid generation methodology that automatically updates the grid during the finite difference simulation of a given structural system directly in the time domain. The structural simulation over such a geometry using elastodynamic partial differential equations (pdes) is itself innovative and gives results directly in the time domain.

The various embodiments incorporate an enhanced elliptic grid generation algorithm (of the type described in U.S. patent application Ser. No. 10/706,478, currently issued as U.S. Pat. No. 7,231,329 on May 23, 2007) and a new three-dimensional finite-difference elastodynamic pde solution methodology in generalized coordinates. This software will enable simulation of dynamics of structural systems with deforming geometries directly in the time domain. An additional reference is "New Boundary Constraints for Elliptic Systems Used in Grid Generation Problems", J. Computational Physics, Vol. 189, 2003, pp 476-492, which is hereby incorporated by reference in its entirety.

The solver of the various embodiments includes three main components. The first component is the enhanced elliptic grid generation algorithm that automatically updates the grid during simulation. The second component is the elastodynamic solver that solves the nine pdes, three for velocity components and six for stress components in generalized curvilinear coordinates over the grid generated by the first component. The third component is a visualization tool, such as the OPENGL based graphics and visualization software tool that animates the solution in time as the simulation proceeds.

The various embodiments take any arbitrary three-dimensional geometry and pass it through the grid solver that generates a smooth grid in generalized curvilinear coordinates about the geometry and then solve the nine elastodynamic pdes over each grid cell to yield the required structural solution. Any updates, if needed, are made to the geometry, a new grid is generated about it, and the structural system is solved again. This process is continued for each time step over the required time of simulation. As the simulation proceeds, results are analyzed and if desired, the simulation is suspended and resumed or stopped altogether. Two novel and unique features of his invention include 1) the innovative enhanced elliptic grid generation algorithm under U.S. patent application Ser. No. 10/706,478; and 2) a new finite difference based elastodynamic solver in three-dimensional generalized curvilinear coordinates which solves for the structural solution directly in the time domain. The overall uniqueness of the innovation lies in that the methods of the various embodiments facilitate autonomous updating of the computational grid in time as the simulation proceeds directly in the time domain.

The various embodiments can be used to study a variety of structural and fluid-structural (in conjunction with a fluid flow solver) problems directly in the time domain in an intuitive fashion, with an ability to inspect and assess the simulation results as the simulation proceeds. There are a host of applications for this innovation from space to aerospace to medical arenas, such as simulation of any structural system deployed in space or on earth and any artificial medical prosthesis in operation.

For one embodiment, the invention provides a method of simulating time-dependent stress data for a structural system. The method includes generating an elliptic grid representative of a geometry of the structural system, the grid comprising a plurality of grid cells, solving elastodynamic partial differential equations having velocity components and stress components in generalized curvilinear coordinates over each grid cell of the elliptic grid, updating the geometry of the structural system in response to solving the elastodynamic partial differential equations and generating a revised elliptic grid representative of the updated geometry of the structural system. For a further embodiment, the invention provides a computer-usable medium containing computer-readable instructions capable of causing a processor to perform the method.

The invention still further provides methods and apparatus of varying scope.

DETAILED DESCRIPTION OF THE INVENTION

Figure 1:
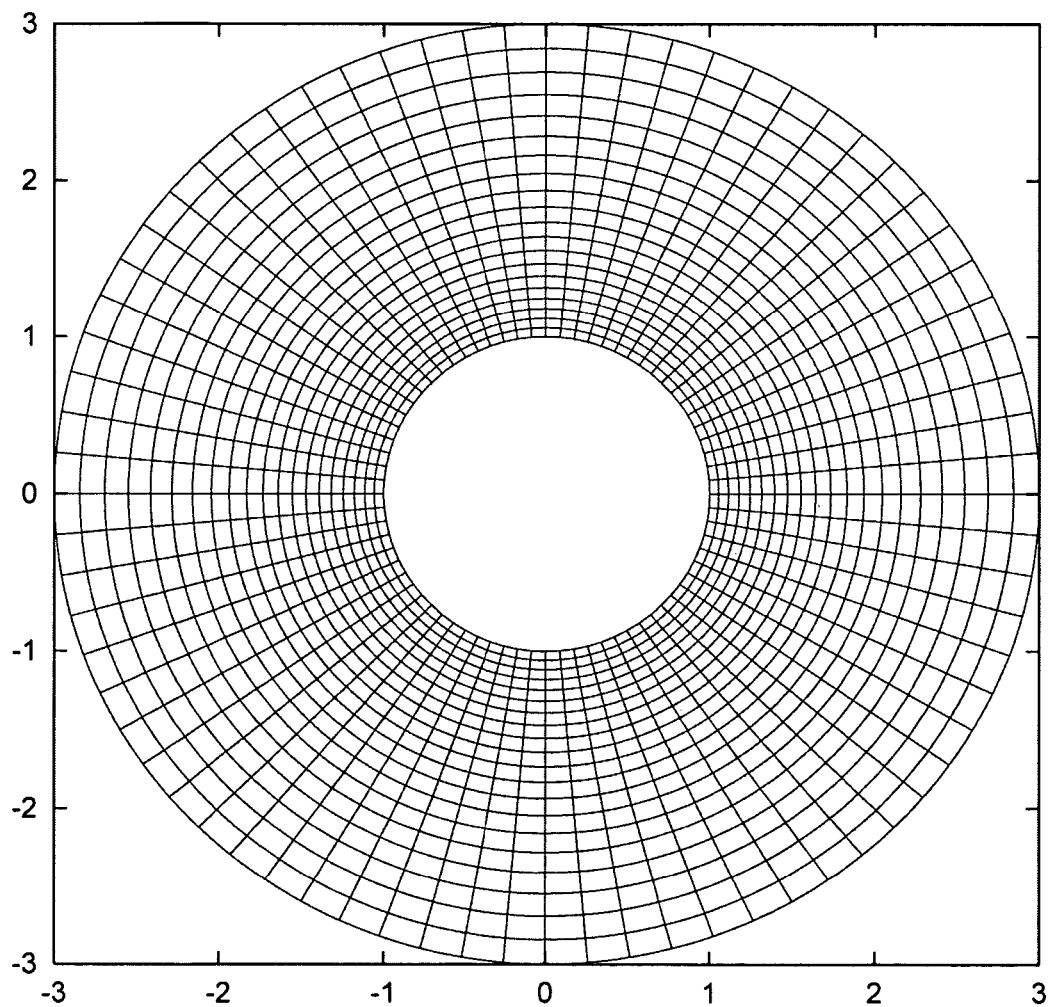
FIG. 1 is a representative grid of an annulus for use with an embodiment of the invention.

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments and variations may be utilized without departing from the scope of the present invention. The following detailed description is, therefore, not to be taken in a limiting sense, and the scope of the present invention is defined only by the appended claims and equivalents thereof.

Governing equation and boundary condition formulation in generalized curvilinear coordinates in three dimensions has been developed using the velocity-stress system of equations of elastodynamics for bodies in rotation. The attendant partial differential equations are solved using a time-staggered leap-frog scheme. The stress boundary conditions in generalized coordinates are derived from a second order tensor transformation from the Cartesian coordinate system. The solution is based on first principles and does not involve lumped parameter or distributed parameter systems approach. The generalized curvilinear coordinate grids for the geometries considered here are created using a new and enhanced elliptic grid generation algorithm. The geometries considered herein as representative embodiments are an annulus, a thin annular disk, a thin solid disk and a thin multi-tooth gear. The solver, referred to herein as Finite-Difference Development of Linear Elasticity (FiDDLE), has been developed to solve the governing equations and generate the predictions. The predictions have been validated by comparing them with the corresponding closed-form axisymmetric steady-state solutions for the annular and disk geometries. Then, predictions are made for a complex geometry of a multi-tooth thin spur gear in steady rotation as well as impulsive rotation from an initial position of rest. The present methodology can be applied to study elastodynamics of complex shaped bodies under arbitrary dynamic loading.

Nomenclature
E=Young's modulus of elasticity
f=body force
J=Jacobian of coordinate transformation
k=bulk modulus
M=metric coefficient matrix
R=right hand side vector
$q_i$, Q=velocity vector
u,v,w=velocity components
x=solution vector
x,y,z, t=Cartesian coordinates and time coordinate
$\delta_{ij}$=Kronecker delta
$\lambda$, $\mu$=Lame constants
$\nabla$=gradient operator
$\Omega$=rotational speed
$\rho$=material density
$\sigma$=Poisson's ratio
$\tau$=symmetric stress tensor
$\xi$, $\eta$, $\zeta$, $\epsilon$=generalized curvilinear coordinates and time coordinate Subscripts
i, j, k=indices for coordinate directions Superscript
T=vector transpose.

The elliptic grid generation methodology makes it possible to generate two-dimensional and three-dimensional grids automatically around or inside arbitrary geometries, without any need for human intervention. For dynamically changing shapes, grids can be regenerated automatically during simulation as and when required. This would be pertinent to cases where a given geometry undergoes deformation such as bending and twist, or where a crack propagates. In the present application of rotating gear component geometries, gear teeth could be subject to deformation, pitting, wear, and eventually cracks, and grids would need to be regenerated due to the corresponding changes in the boundary configuration. Having resolved the difficulty of automatically updating the grids during a simulation, the finite-difference modeling of such problems has now become attractive.

The need for numerical simulation of dynamic stresses over gears in mesh in both normal and damaged states has been delineated by the lack of any normal vibration data or any anomalous vibration data that may reflect the presence of gear damage such as in a pinion of an OH-58 helicopter transmission. Such simulated "clean" and "fault data" would aid in developing and enhancing fault-detection algorithms for such rotating systems by first, calibrating the damage-detection algorithms with the simulated clean vibration data and second, by validating these damage detection algorithms against simulated data corresponding to known damage. In these simulations, various forms of damage can be seeded and allowed to propagate in time and the corresponding data generated. In general, in such simulations, a vast variety of faults can be introduced into the system of interest, and the corresponding data could be recorded for use in the developmental work on fault-detection algorithms.

Toward this end, as a first step, the present three-dimensional solver has been developed and validated by comparing its predictions with the known two-dimensional and three-dimensional theoretical steady-state solutions. The agreement has been shown to be good.

Governing Equations

The three-dimensional linear elastodynamic equations of motion describing the principle of momentum conservation and the constitutive equations governing the wave phenomena within an isotropic elastic body can be written as a system of nine equations, three for the velocities and six for the stresses, respectively. The velocity equations are given by:

$$\rho \partial_t q_i = \partial_j \tau_{ij} + f_i \qquad \text{Eq. 1}$$

where the velocity vector, $q_i$=(u, v, w). The body force vector is given by $f_i$=($f_x$, $f_y$, $f_z$), and the symmetric stress tensor, $\tau_{ij}$, has six distinct components. The stress tensor is expressed by the following tensorial equation:

$$\partial_t \tau_{ij} = \lambda \delta_{ij} \operatorname{div} Q + \mu(\partial_j q_i + \partial_i q_j) \qquad \text{Eq. 2}$$

where div Q is the divergence of the velocity vector, Q ($q_j$), $\delta_{ij}$ is the Kronecker delta, and where $\lambda$ and $\mu$ are the Lame constants—these elastic constants (e.g., $\mu = \tau_{xy}/e_{xy}$ is the rigidity or the elastic shear modulus, $e_{xy}$ is the strain caused by the stress $\tau_{xy}$ in the xy plane) characterizing the elastic behavior of the body are related to the Young's modulus of elasticity E, the Poisson's ratio $\sigma$ and the bulk modulus k by the following relations:

$$E = \mu(2\mu + 3\lambda)/(\mu + \lambda)$$

$$\sigma = \lambda/(2)(\mu + \lambda))$$

$$k = E/(3(1 - 2\sigma))$$

The elastic quantities $\mu$ and $\lambda$ are functions of space for a nonhomogeneous body.

In the rotating frame of reference, the velocity equations (1) become:

$$\rho \partial_t q_i = \partial_j \tau_{ij} + \partial_i (|\Omega \times r|^2/2) + 2\epsilon_{ijk} q_j \omega_k + f_i \qquad \text{Eq. 3}$$

where $|\Omega|$ is a constant rotational speed ($\Omega = \omega_k$), r=(x,y,z) is a positional vector, second and third terms on the right hand side represent the centrifugal and Coriolis forces associated with the rotating frame of reference.

In generalized orthogonal curvilinear coordinates, Equations 2 and 3, can be shown to assume the following flux-conservative form:

$\partial_\tau(A/J)$ $+\partial_\xi[(A/J)\xi_t-(1/J)(\xi_x B+\xi_y C+\xi_z D)]$ $+\partial_\eta[(A/J)\eta_t-(1/J)(\eta_x B+\eta_y C+\eta_z D)]$ $+\partial_\zeta[(A/J)\zeta_t-(1/J)(\zeta_x B+\zeta_y C+\zeta_z D)]=R/J$  Eq. 4 where $A=[\rho u,\rho v,\rho w,\tau_{xx},\tau_{xy},\tau_{xz},\tau_{yy},\tau_{yz},\tau_{zz}]^T$ $B=[\tau_{xx},\tau_{xy},\tau_{xz},(\lambda+2\mu)u,\mu v,\mu w,\lambda u,0,\lambda u]^T$ $C=[\tau_{xy},\tau_{yy},\tau_{yz},\lambda v,\mu u,0,(\lambda+2\mu)v,\mu w,\lambda v]^T$ $D=[\tau_{xz},\tau_{yz},\tau_{zz},\lambda w,0,\mu\mu,\lambda w,\mu v,(\lambda+2\mu)w]^T$ Jacobian of the transformation, J, is given by $\partial(x,y,z)/\partial(\xi,\eta,\zeta)$, and the metric quantities, $\xi_t$, $\xi_x$, etc. have their usual meanings. The right hand side column vector, R, contains the centrifugal and Coriolis terms and additionally terms containing spatial derivatives of the elastic constants, for nonhomogeneous bodies.

Physical quantities are normalized with the Young's modulus, E, the acoustic speed, $\sqrt{(\lambda+2\mu)/\rho}$, and the characteristic dimension such as the radius, r, for a solid disk or a shaft and $(r_{out}-r_{in})$ for an annulus or an annular disk.

Boundary Conditions

The two-dimensional and three-dimensional validation examples presented here have corresponding axisymmetric steady-state theoretical solutions, and the predictions are directly compared with these theoretical solutions for a rotating annulus (two-dimensional), rotating thin annular disk (three-dimensional) and a rotating thin solid disk (three-dimensional). Boundary conditions corresponding to these closed-form solutions are transformed from the generalized coordinate space, $(\xi,\eta,\zeta)$, to Cartesian coordinates, $(x,y,z)$, using contravariant tensor transformation. For example, second order stress tensor transformation between $(x,y,z)$ space and $(\xi,\eta,\zeta)$ space is:

$$\tau_{ij} = \sum_{k=1}^{3}\sum_{l=1}^{3} \frac{\partial \chi^i}{\partial x^l}\frac{\partial \chi^j}{\partial x^k}\tau^{lk}$$

where $\chi^i=(\xi,\eta,\zeta)$, i, j span $(\xi,\eta,\zeta)$ space and l, k span $(x,y,z)$ space. The contravariant stress tensor transformation given above does not include normalizing factors. Using normalization, this transformation in matrix form can be written as:

Mx=R where the metric coefficient matrix, $$M = \begin{pmatrix} \xi_x^2 & 2\xi_x\xi_y & 2\xi_x\xi_z & \xi_y^2 & 2\xi_y\xi_z & \xi_z^2 \\ \xi_x\eta_x & (\xi_x\eta_y+\eta_x\xi_y) & (\xi_x\eta_z+\eta_x\xi_z) & \xi_y\eta_y & (\xi_y\eta_z+\eta_y\xi_z) & \xi_z\eta_z \\ \xi_x\zeta_x & (\xi_x\zeta_y+\zeta_x\xi_y) & (\xi_x\zeta_z+\zeta_x\xi_z) & \xi_y\zeta_y & (\xi_y\zeta_z+\zeta_y\xi_z) & \xi_z\zeta_z \\ \eta_x^2 & 2\eta_x\eta_y & 2\eta_x\eta_z & \eta_y^2 & 2\eta_y\eta_z & \eta_z^2 \\ \eta_x\zeta_x & (\eta_x\zeta_y+\zeta_x\eta_y) & (\eta_x\zeta_z+\zeta_x\eta_z) & \eta_y\zeta_y & (\eta_y\zeta_z+\zeta_y\eta_x) & \eta_z\zeta_z \\ \zeta_x^2 & 2\zeta_x\zeta_y & 2\zeta_x\zeta_z & \zeta_y^2 & 2\zeta_y\zeta_z & \zeta_z^2 \end{pmatrix}$$

solution vector, $x=[\tau_{xx},\tau_{xy},\tau_{xz},\tau_{yy},\tau_{yz},\tau_{zz}]^T$ and the right-hand side vector, $r=[|\nabla\xi|^2\tau_{\xi\xi},|\nabla\xi||\nabla\eta|\tau_{\xi\eta},|\nabla\xi||\nabla\zeta|\tau_{\xi\zeta},|\nabla\eta|^2\tau_{\eta\eta},$
$|\nabla\eta||\nabla\zeta|\tau_{\eta\zeta},|\nabla\zeta|^2\tau_{\zeta\zeta}]^T$ In a two-dimensional Cartesian coordinate system $(y,z)$, the stresses would be related to their counterparts in the generalized coordinates $(\eta, \zeta)$ as:

$$\tau_{yy} = \frac{1}{J'^2}[|\nabla\eta|^2\zeta_z^2\tau_{\eta\eta} - 2|\nabla\eta||\nabla\zeta|\eta_z\zeta_z\tau_{\eta\zeta} + |\nabla\zeta|^2\eta_z^2\tau_{\zeta\zeta}]$$

$$\tau_{yz} = \frac{1}{J'^2}[-|\nabla\eta|^2\zeta_y\zeta_z\tau_{\eta\eta} + |\nabla\eta||\nabla\zeta|(\eta_y\zeta_z + \eta_z\zeta_y)\tau_{\eta\zeta} - |\nabla\zeta|^2\eta_y\eta_z\tau_{\zeta\zeta}]$$

and $$\tau_{zz} = \frac{1}{J'^2}[|\nabla\eta|^2\zeta_y^2\tau_{\eta\eta} - 2|\nabla\eta||\nabla\zeta|\eta_y\zeta_y\tau_{\eta\zeta} + |\nabla\zeta|^2\eta_y^2\tau_{\zeta\zeta}]$$

where the Jacobian of the transformation, J', is given by $$\frac{\partial(\eta,\zeta)}{\partial(x,y)} = \eta_y\zeta_z - \eta_z\zeta_y,$$

and $\nabla$ is the gradient operator. Here, the orthogonal generalized coordinates, $(\eta, \zeta)$, correspond to the polar coordinates $(\theta, r)$.

In general, for a three-dimensional case, the stress tensors in the two coordinate systems would be related by the matrix form given above, i.e., $x=M^{-1}R$.

The velocity boundary conditions are either of the Dirichlet type or of the Neumann type; the latter being derived from the governing equations for the velocity vector, once the stress tensor is updated at the boundaries according to the preceding formulation.

Equation 4 in two-dimensional $(y,z)$ or $(\eta, \zeta)$ system can be written as:

$\partial_\tau A=M'A_\zeta+L'A_\eta+R$  Eq. 4a where M' and L' are matrices containing the variable $\rho$ and various metric quantities, and R is the term containing body forces and any traction by way of boundary conditions. Equation 4a can further be written as:

$\partial_\tau A=U\Lambda U^{-1}A_\zeta+L'A_\eta+R$  Eq. 4b or as:

$\partial_\tau A=UX+L'A_\eta+R$  Eq. 4c where $X=\Lambda U^{-1}A_\zeta$ is a vector of two incoming characteristics, two outgoing characteristics and one neutral characteristic corresponding to the zero eigenvalue of the matrix M'. Therefore, on the boundaries, the solution variables are thus expressed in terms of these characteristics.

Numerical Method

A second-order in time and space, time-staggered leap frog method is used to integrate the velocity and stress equations. Both the spatial derivatives and time derivatives are discretized using central differences. A very small numerical damping term is used to eliminate the mesh drifting (checkerboard) instability. For one embodiment, a sampling rate of the order of 50 KHz is of interest, e.g., a 50 KHz sampling rate for the flight data of the OH-58 helicopter. For a further embodiment, the time step restriction imposed by the CFL condition of hyperbolic systems akin to explicit methods for integration of the dynamic system are of the same order as those posed by the sampling rate of interest. For example, for a steel shaft of radius equal to 20 cm rotating at 100 revolutions per second (rps), a typical time step may be of the order of a microsecond, which translates to a simulation sampling rate on the order of 100 KHz.

Results

The predicted values of stresses shown are normalized by the Young's modulus, $E=2.1\times10^{12}$ dyne/cm$^2$, for the steel gear considered here. The lengths are normalized by the inner radius of the gear. Some steady-state theoretical results from linear elasticity were used as validation and verification base for the computations. Validation was done using three test cases: a rotating annulus (two-dimensional), a rotating thin annular disk (three-dimensional) and a rotating thin solid disk (three-dimensional). Then, predictions for a multi-tooth thin gear are presented.

Rotating Annulus

The thickness of the axisymmetric rotating annulus is assumed to be sufficiently small as compared to its radius so that the radial and tangential stresses do not vary over its thickness. This case is thus referred to as a rotating annulus here to avoid any confusion that may arise when we discuss the three-dimensional rotating annular disk with small finite thickness where the radial and tangential stresses do vary over the thickness of the disk. The closed form solution for the rotating annulus is given in Timoshenko, S. P. and Goodier, J. N., *Theory of Elasticity*, McGraw-Hill, Inc., 1934. The weight of the annulus is neglected. FIG. 1 is a representative 72×21 grid of an annulus for use with an embodiment of the invention. The annulus includes 72 grid points in the circumferential direction and 21 points in the radial direction. The annulus further has an inner and outer radii of 10 cm and 30 cm, respectively.

Figure 2A:
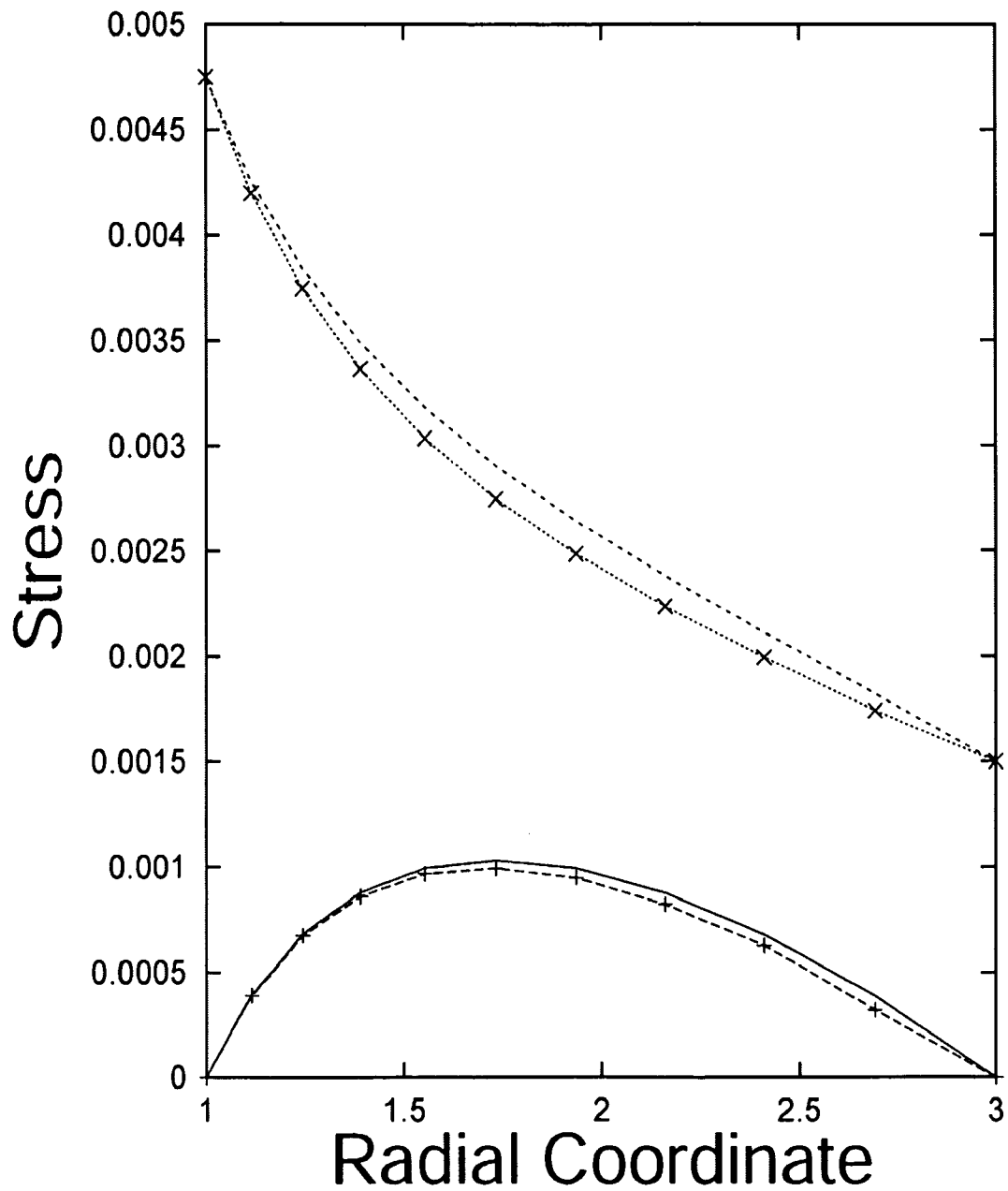
FIGS. 2A-2B are plots of radial and tangential stress for an annulus rotating at 100 rps comparing analytical and the computed results for two different grid resolutions in accordance with an embodiment of the invention at various grid dimensions.
Figure 2B:
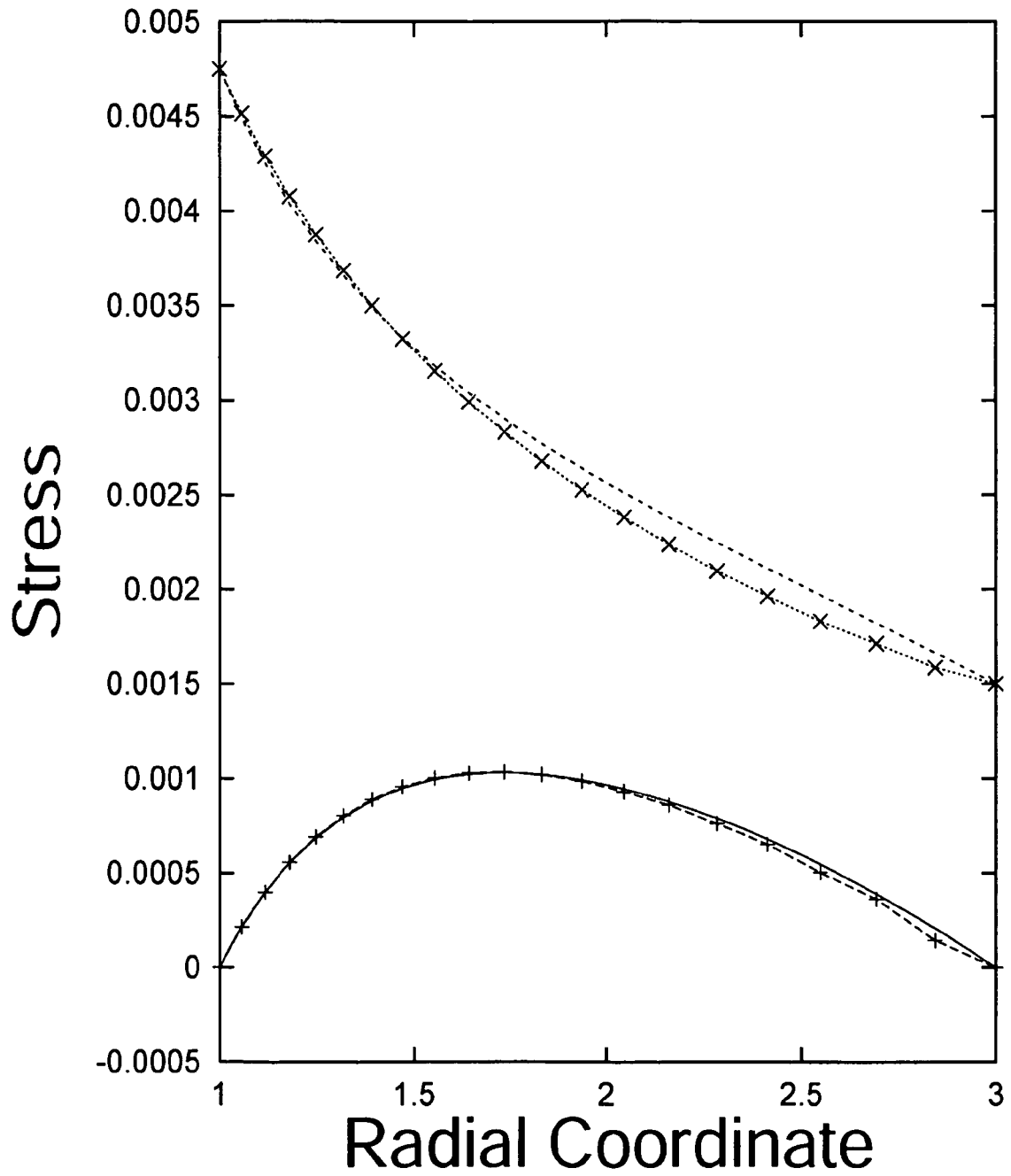

Results for an annulus of the type shown in FIG. 1 are shown for various grid dimensions and rotational speeds in FIGS. 2A-2B and 3A-3B. FIG. 2A shows a comparison between the analytical and the computed results at 100 rps. The abscissa shows the coordinate along any radial line from the inner radius to the outer radius, and the ordinate shows the normalized stress. The analytical, or theoretical, radial and tangential stress distributions along this radial ray are shown in solid and dotted lines respectively, and the computed radial and tangential stress distributions are shown in dashed and dotted lines with crosses respectively. Agreement between the computed and the analytical results is satisfactory. The grid used for this case is 72×11, 11 points in the radial direction and 72 points along the circumferential direction. As the grid is refined to 72×21, an improvement is seen in the predictions, and the comparison with the theoretical results is good, as is shown in FIG. 2B.

Figure 3A:
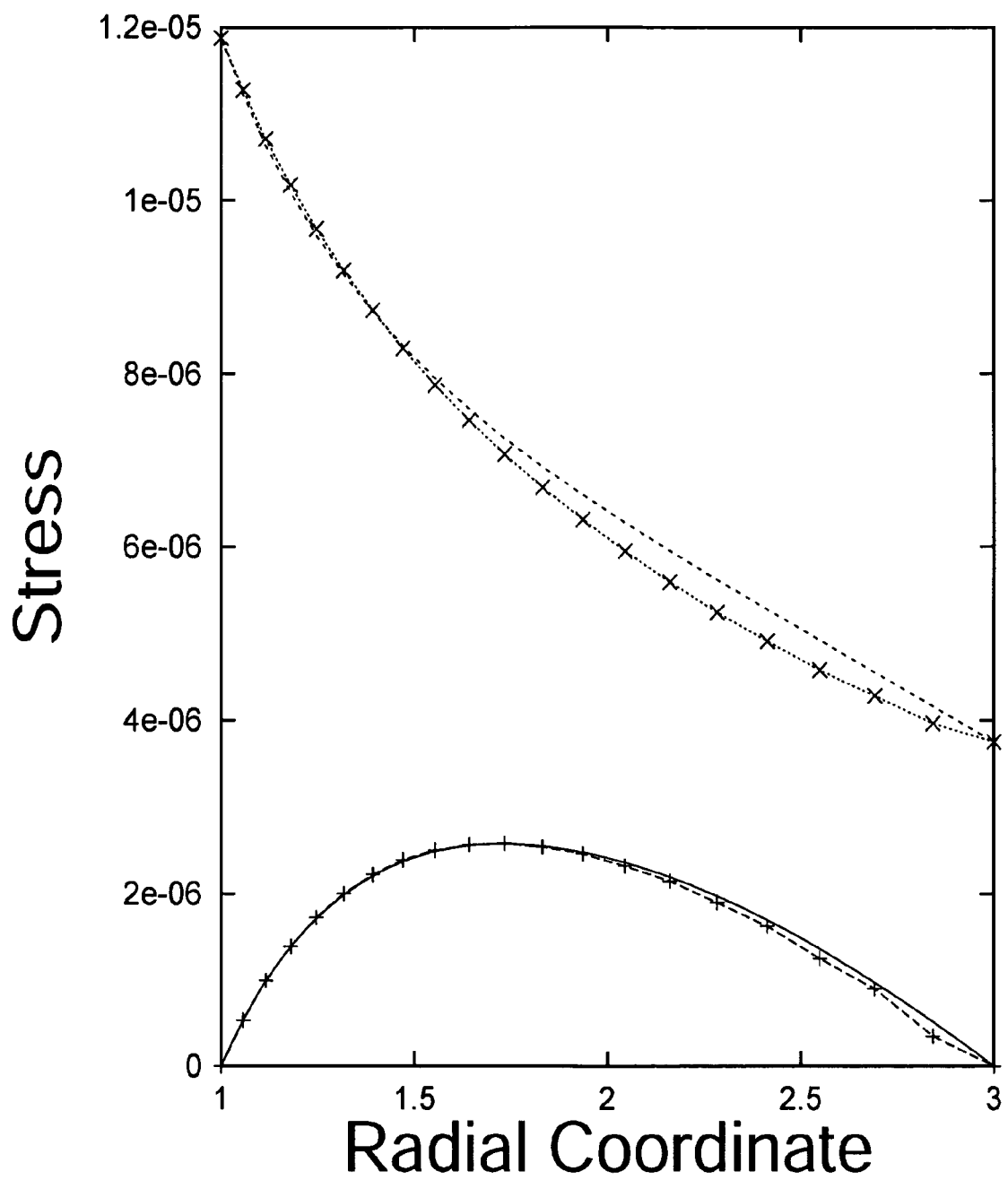
FIGS. 3A-3B are plots of radial and tangential stress for an annulus rotating at 5 rps and 2000 rps, respectively, comparing analytical and the computed results in accordance with an embodiment of the invention at various speeds of rotation.
Figure 3B:
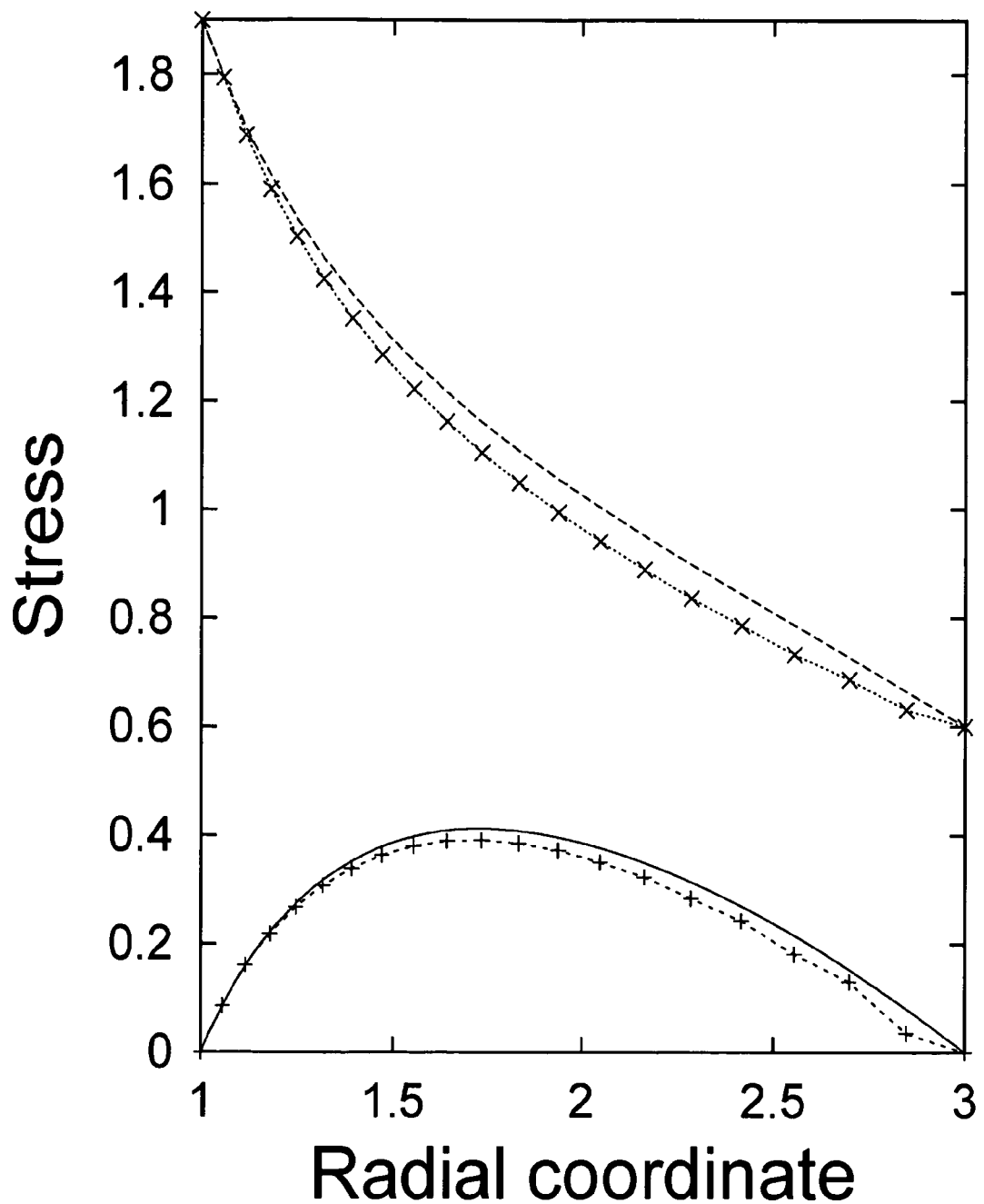

Results for the rotational speed of 5 rps with a grid of 72×21 are shown in FIG. 3A. Agreement between the predictions and the theoretical results is good, just as in the case of 100 rps. Next, results for a high rotational speed of 2,000 rps with the same grid (72×21) are shown in FIG. 3B. Agreement between the predicted and theoretical radial stress distributions continues to be good, but is subject to improvement with a finer grid. Grid dependence of the solution will be shown later in the case of a rotating thin solid disk.

Rotating Thin Annular Disk

Figure 4:
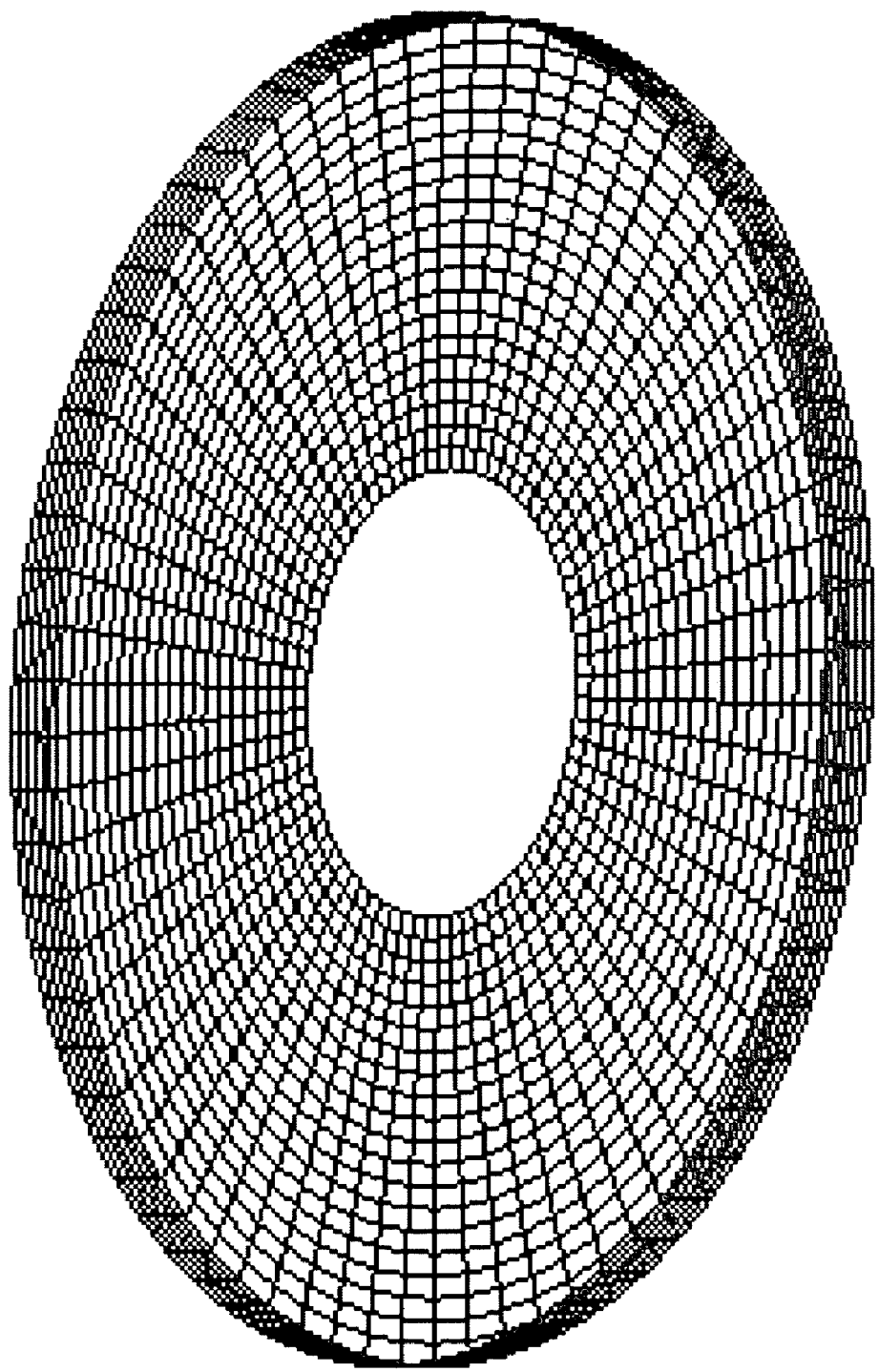
FIG. 4 is a representative grid of an annular disk for use with an embodiment of the invention.

An approximate theoretical solution of a rotating thin annular disk is given in Love, A. E. H., *A Treatise on the Mathematical Theory of Elasticity*, Dover, N.Y., 1944. The problem is treated as that of plane stress, in which the only nontrivial stress components are the radial and the tangential stresses as in the case of the two-dimensional annulus, but now they also have a weak dependence on the thickness of the disk (along the axial direction). The thickness of the disk is taken to be 2.5 cm, while the inner and outer radii of the disk are 10 cm and 30 cm respectively, just as in the case of the two-dimensional annulus. The theoretical solution is in defect near the ends, but is good at axial stations removed from the end planes. Here, the radial stress does not vanish along the outer or inner radii, as in the case of the annulus, but the resultant radial tension between any two planes not too close to the end planes along the inner and outer radii vanishes. FIG. 4 is a representative 72×21×7 grid of an annular disk for use with an embodiment of the invention, with 7 points along the axial direction, 21 points along the radial direction and 72 points along the circumferential direction.

Figure 5A:
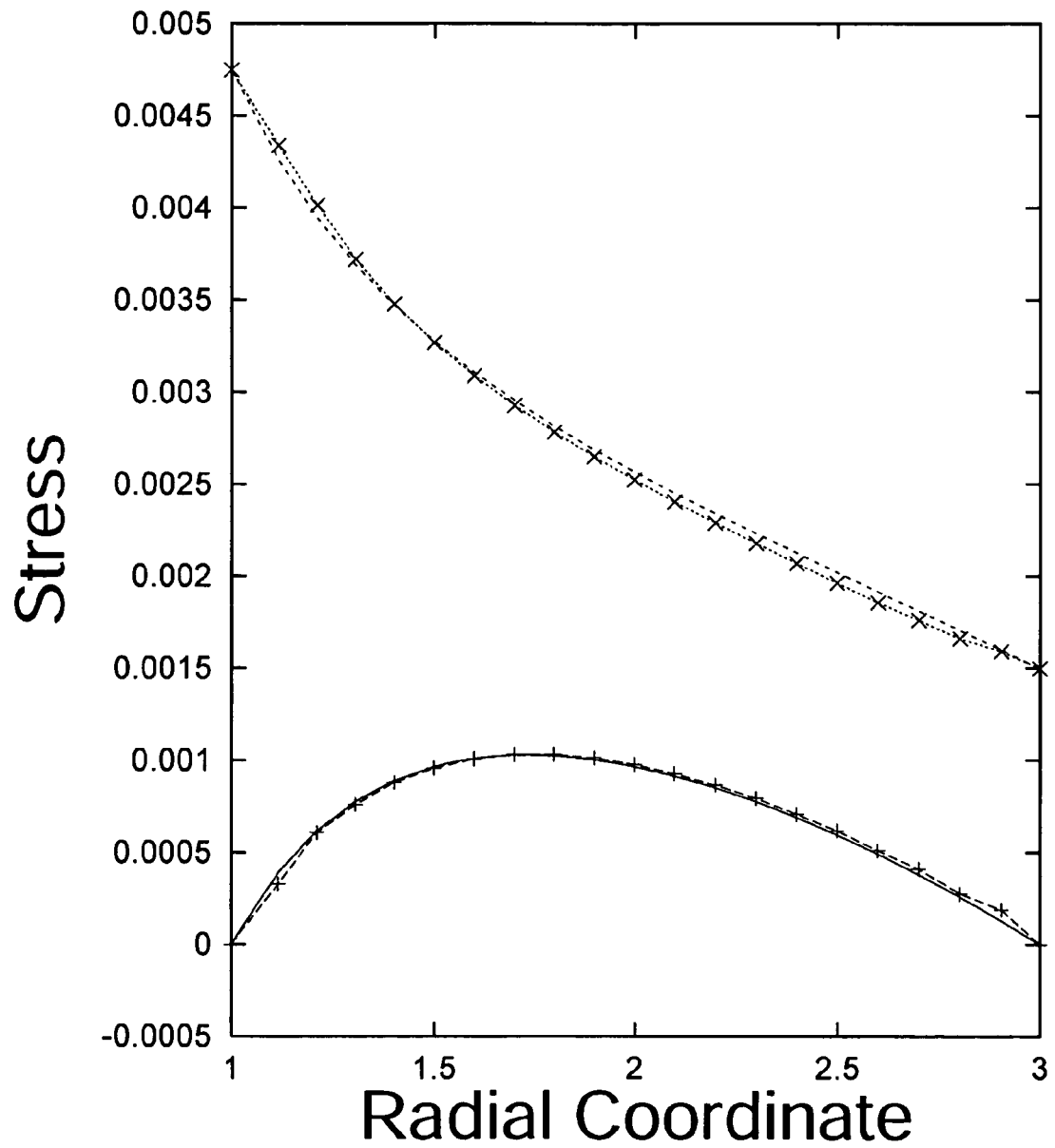
FIGS. 5A-5C are plots of radial and tangential stress for a thin annular disk rotating at 100 rps comparing analytical and the computed results at various axial stations in accordance with an embodiment of the invention.
Figure 5B:
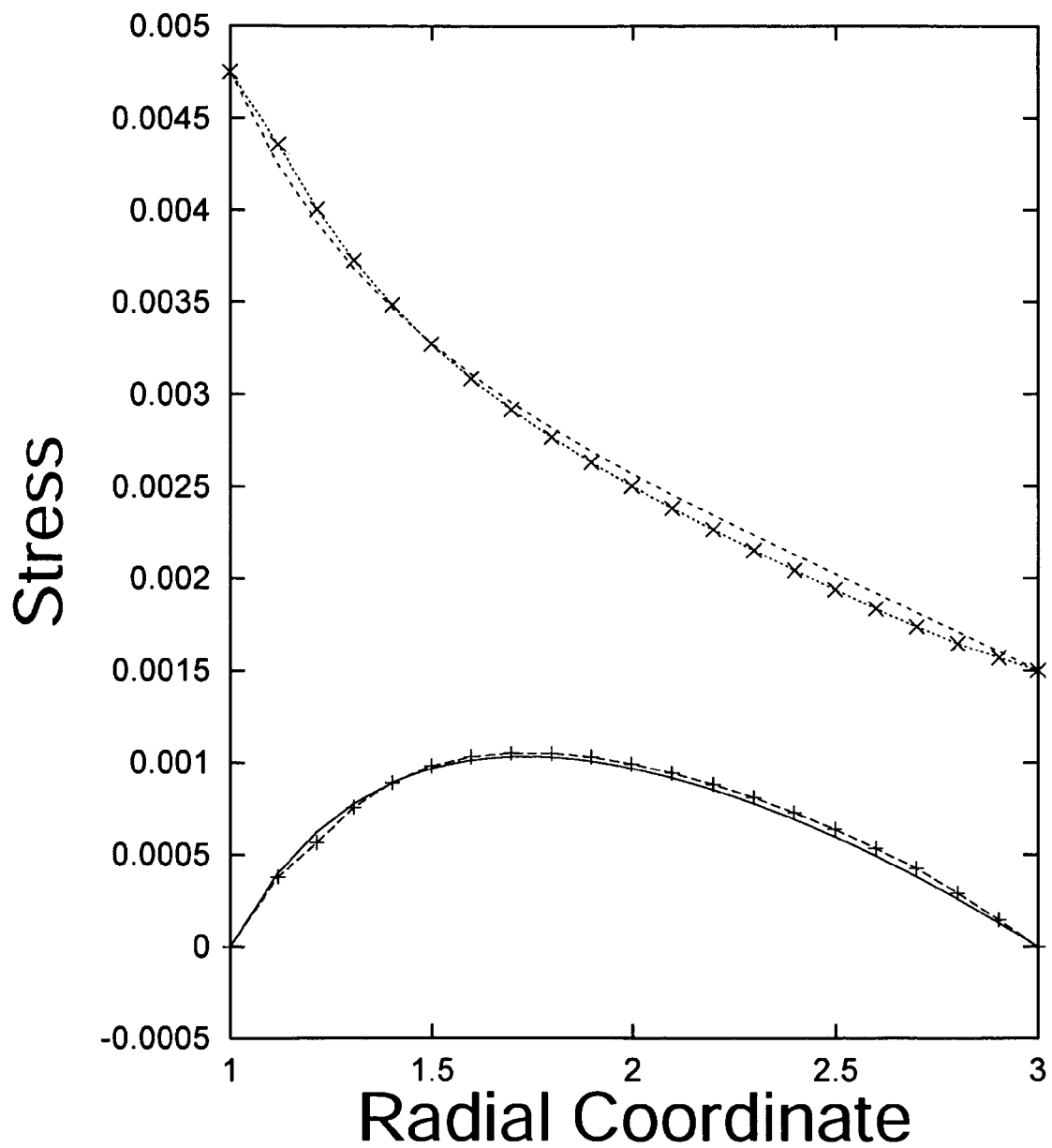
Figure 5C:
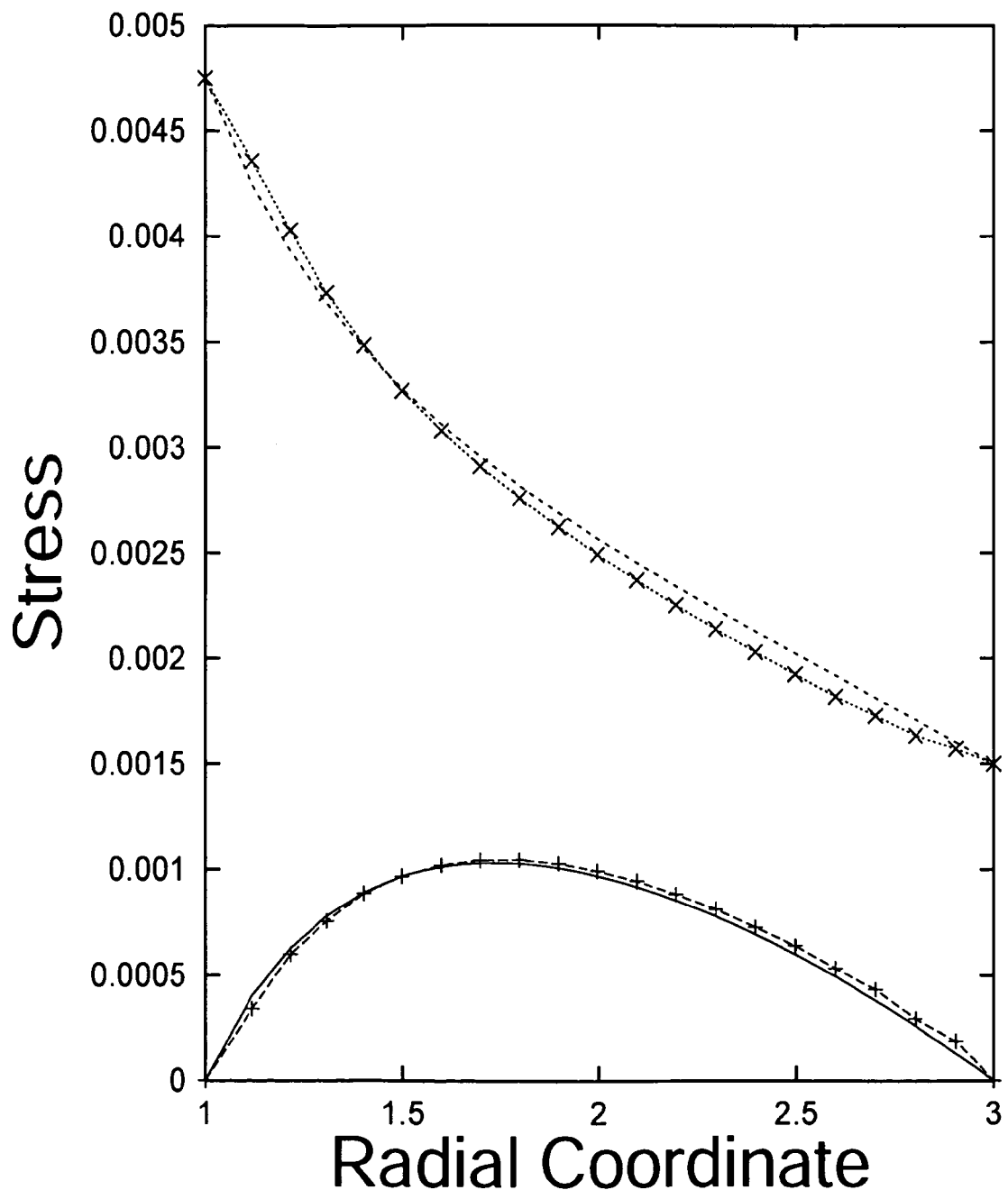

Results at three axial stations are shown in FIGS. 5A-5C. FIG. 5A shows the stresses at the plane next to the end plane; FIG. 5B shows the stresses at the section quarter thickness removed from the end plane; FIG. 5C shows the stresses at the mid-section of the disk. As before, predictions are shown with lines with crosses. The rotational speed of the disk is taken as 100 rps, which is of the same order as the rpm rate of the pinion gear for an OH-58 helicopter transmission. The agreement between the predictions and the theory is quite good.

Rotating Thin Solid Disk

An approximate theoretical solution of a rotating solid thin disk is given in Timoshenko, S. P. and Goodier, J. N., *Theory of Elasticity*, McGraw-Hill, Inc., 1934 and Love, A. E. H., *A Treatise on the Mathematical Theory of Elasticity*, Dover, N.Y., 1944. This case is similar to the thin annular disk with the difference that there is no inner radius here, and therefore the attendant vanishing radial tension condition at the inner radius becomes moot.

A non-orthogonal cross-sectional grid is generated for the solid disk to avoid a polar coordinate singularity at the origin. Since the governing equations used in this study are strictly valid for an orthogonal curvilinear coordinate system, there is bound to be some discrepancy between the predictions and theory. The choice of the non-orthogonal cross-sectional grid in this case will thus help quantify the prediction errors associated with departure from a strictly orthogonal grid.

The first grid, a coarse grid used for the thin solid disk is taken to be 21×21×7, with 7 points along the axial direction, 21 points along the radial and circumferential directions. The radius of the disk is considered to be 10 cm and its thickness 2.5 cm. The grids are progressively refined from 21×21×7 to 41×41×11 to 61×61×11 to 81×81×11 to see the improvement in the predictions.

Boundary conditions at the end planes are imposed from theory. The rotational speed of the disk is taken as 100 rps.

Figure 6A:
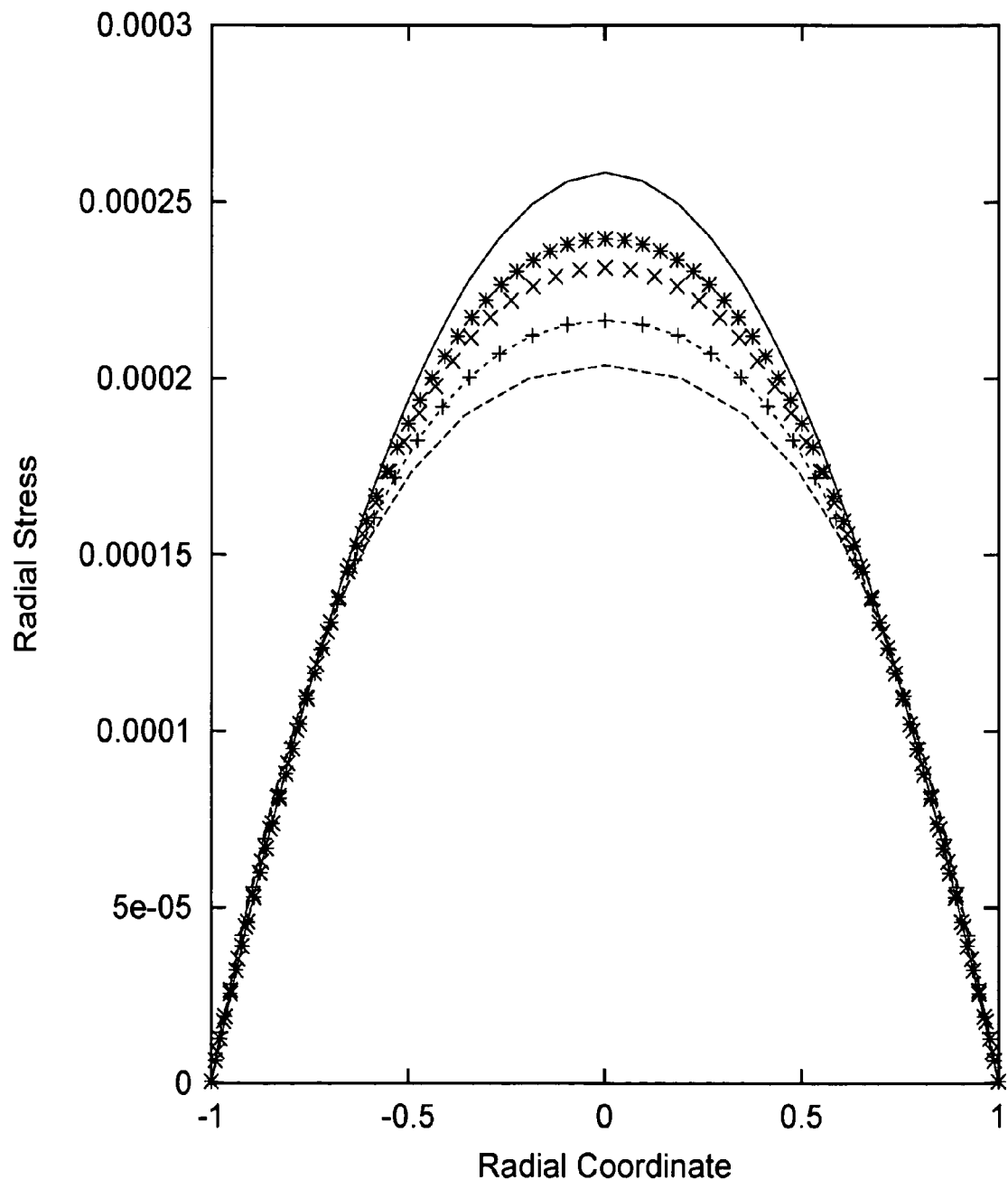
FIGS. 6A-6B are plots of stress for a thin solid disk comparing analytical and the computed results in accordance with an embodiment of the invention at the quarter-thickness plane of a disk using various grid resolutions.
Figure 6B:
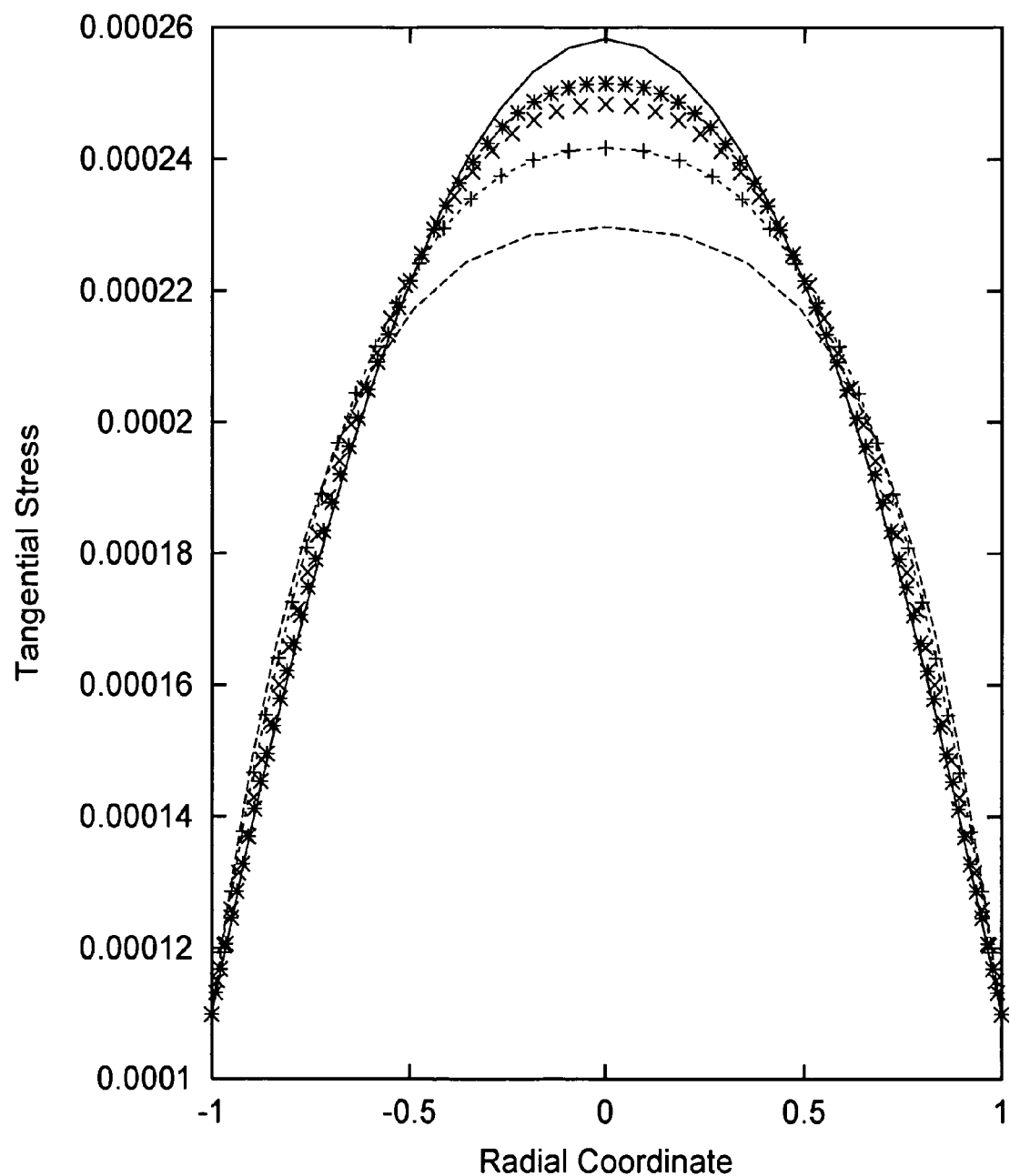

FIGS. 6A-6B show the predicted stresses at the quarter-thickness plane. FIG. 6A shows the radial stresses and FIG. 6B shows the tangential stresses. Predictions are shown with lines with points and symbols and the theoretical stresses in solid line. Agreement between the predictions and the theoretical results improves as the grid is refined from 21×21×7 to 41×41×11 to 61×61×11 to 81×81×11. At 81×81×11 grid resolution, the predictions agree very well with the theory. As anticipated, any errors in the predictions at this stage may be due to the grid nonorthogonality, as discussed earlier, but it should be noted that the theoretical solution itself is also approximate.

Figure 7A:
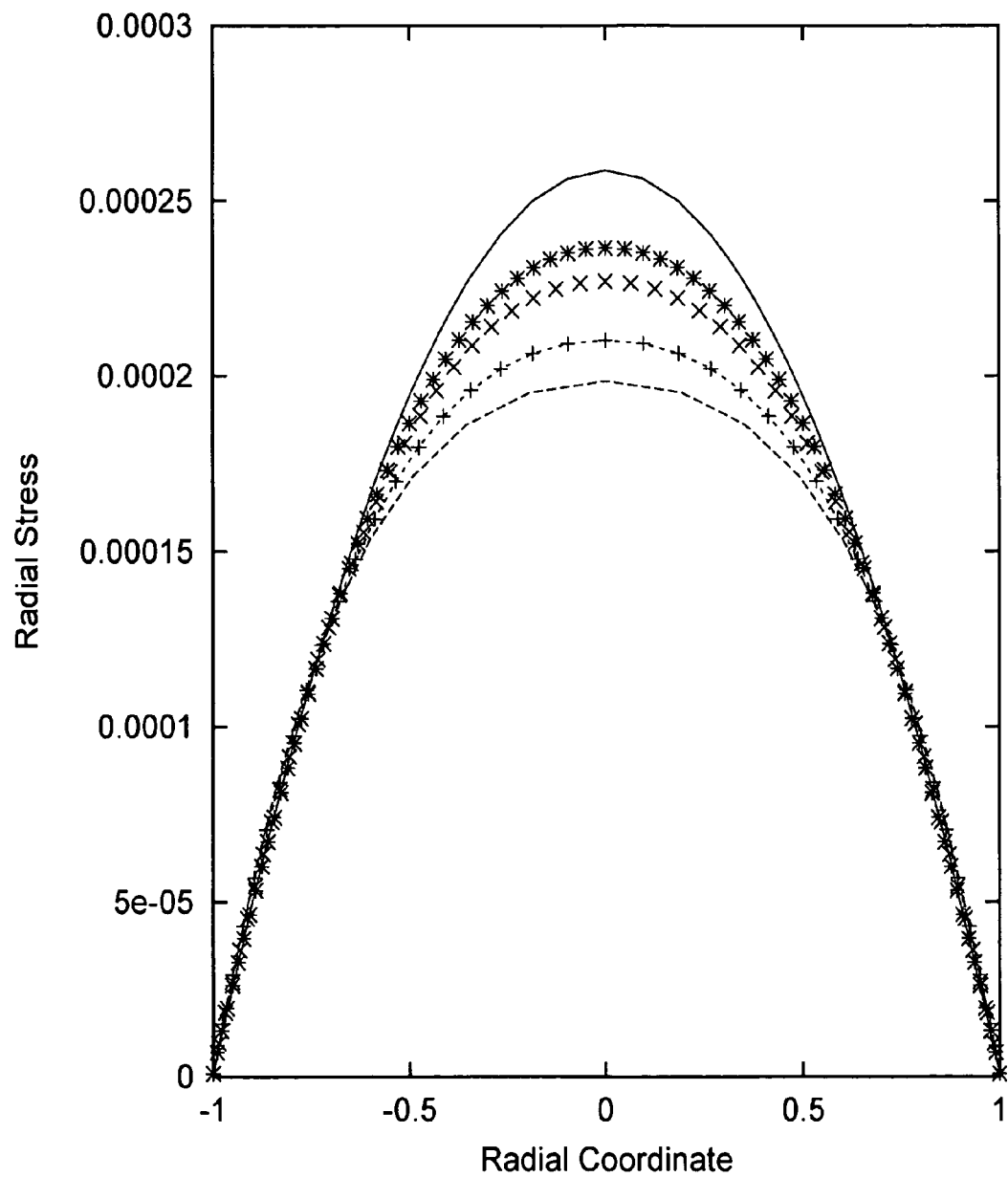
FIGS. 7A-7B are plots of stress for a thin solid disk comparing analytical and the computed results in accordance with an embodiment of the invention at the mid-plane of a disk using various grid resolutions.
Figure 7B:
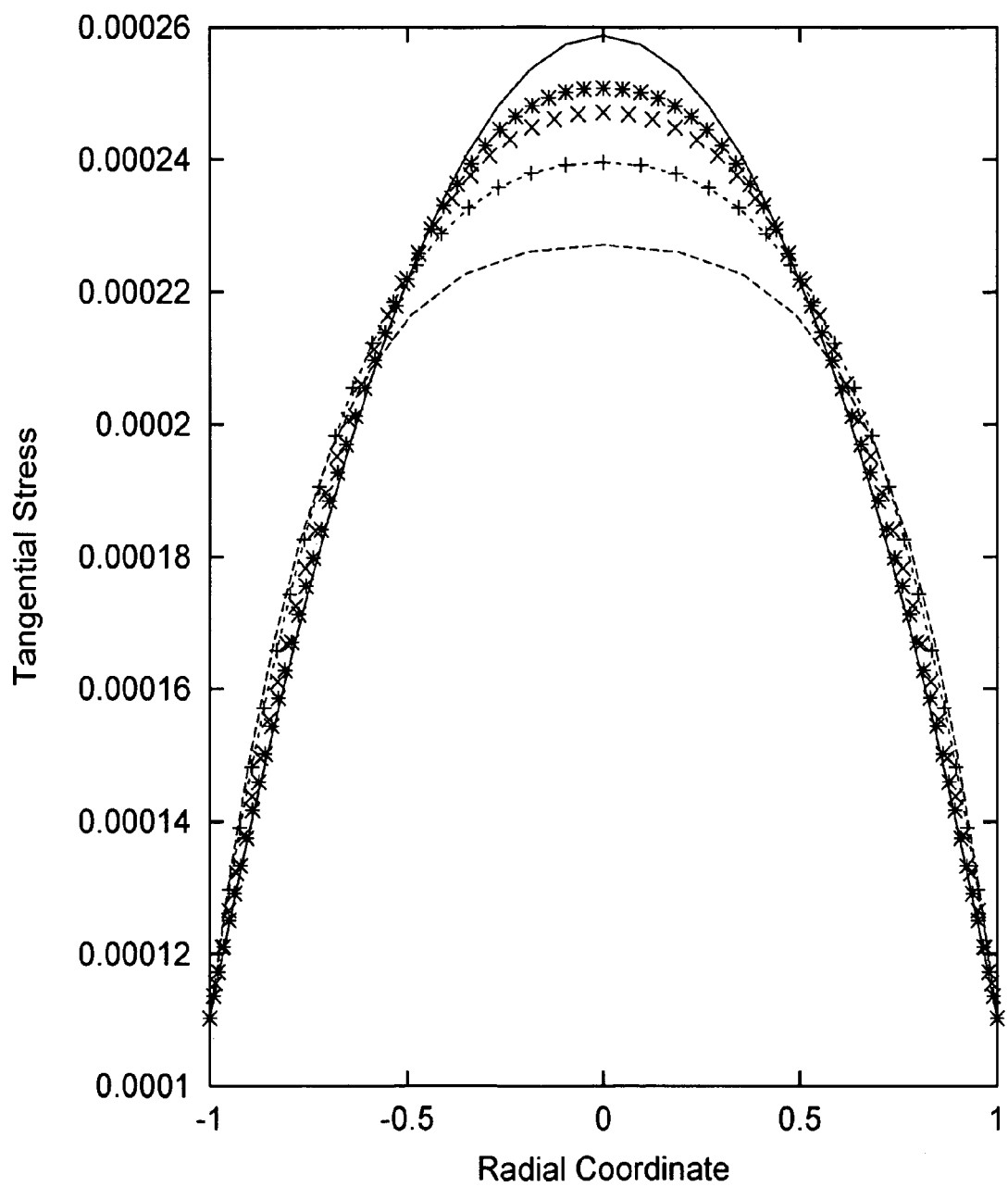

FIGS. 7A-7B show the predicted stresses at the mid-plane using the same grid resolutions as with FIGS. 6A-6B. FIG. 7A shows the radial stresses and FIG. 7B shows the tangential stresses. Predictions are shown with lines with points and symbols and the theoretical stresses in solid line. As expected, the predictions are progressively improved as the grid is refined.

Figure 8A:
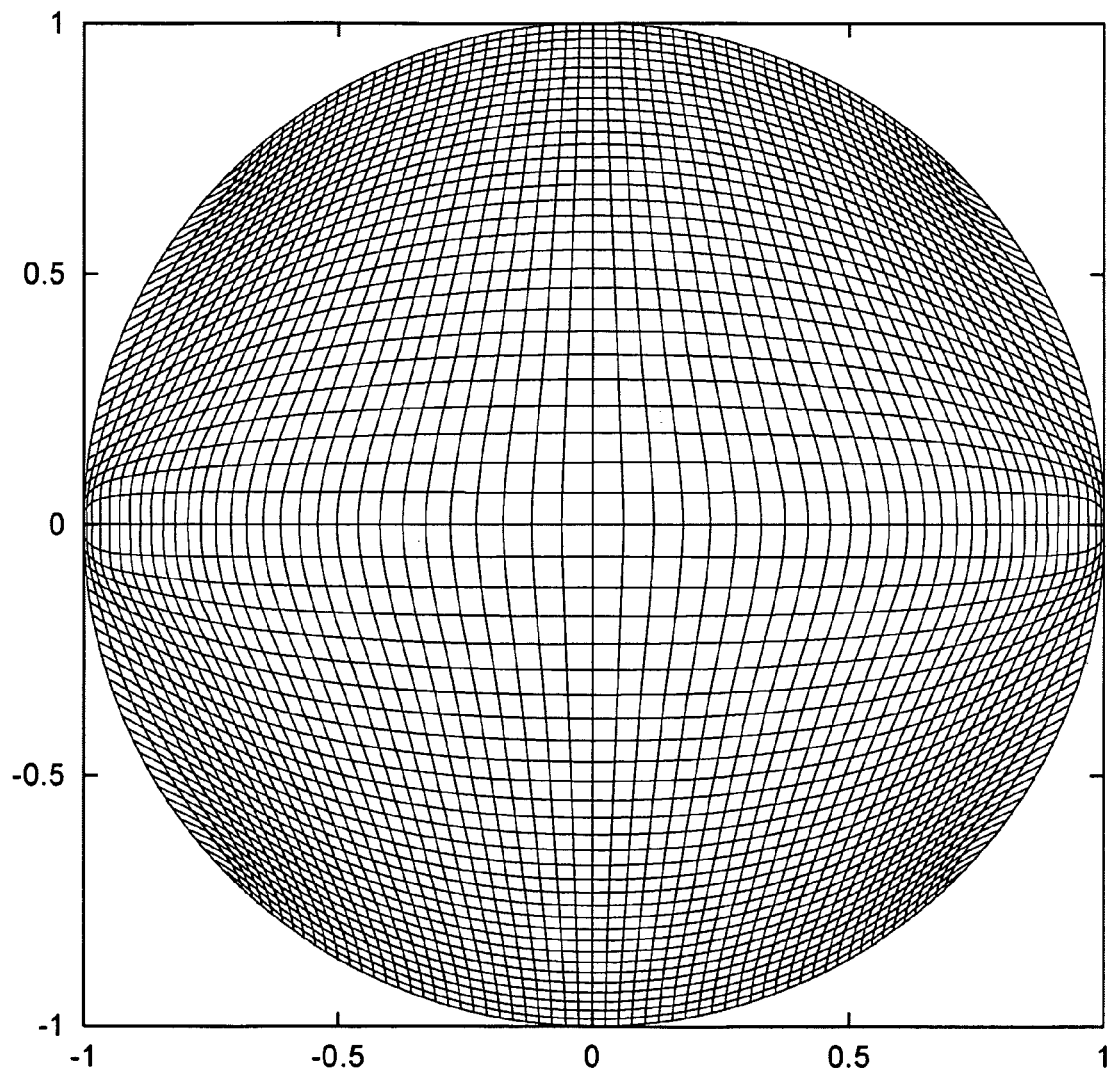
FIG. 8A is a cross-sectional view of a representative three-dimensional grid of a thin solid disk for use with an embodiment of the invention.
Figure 8B:
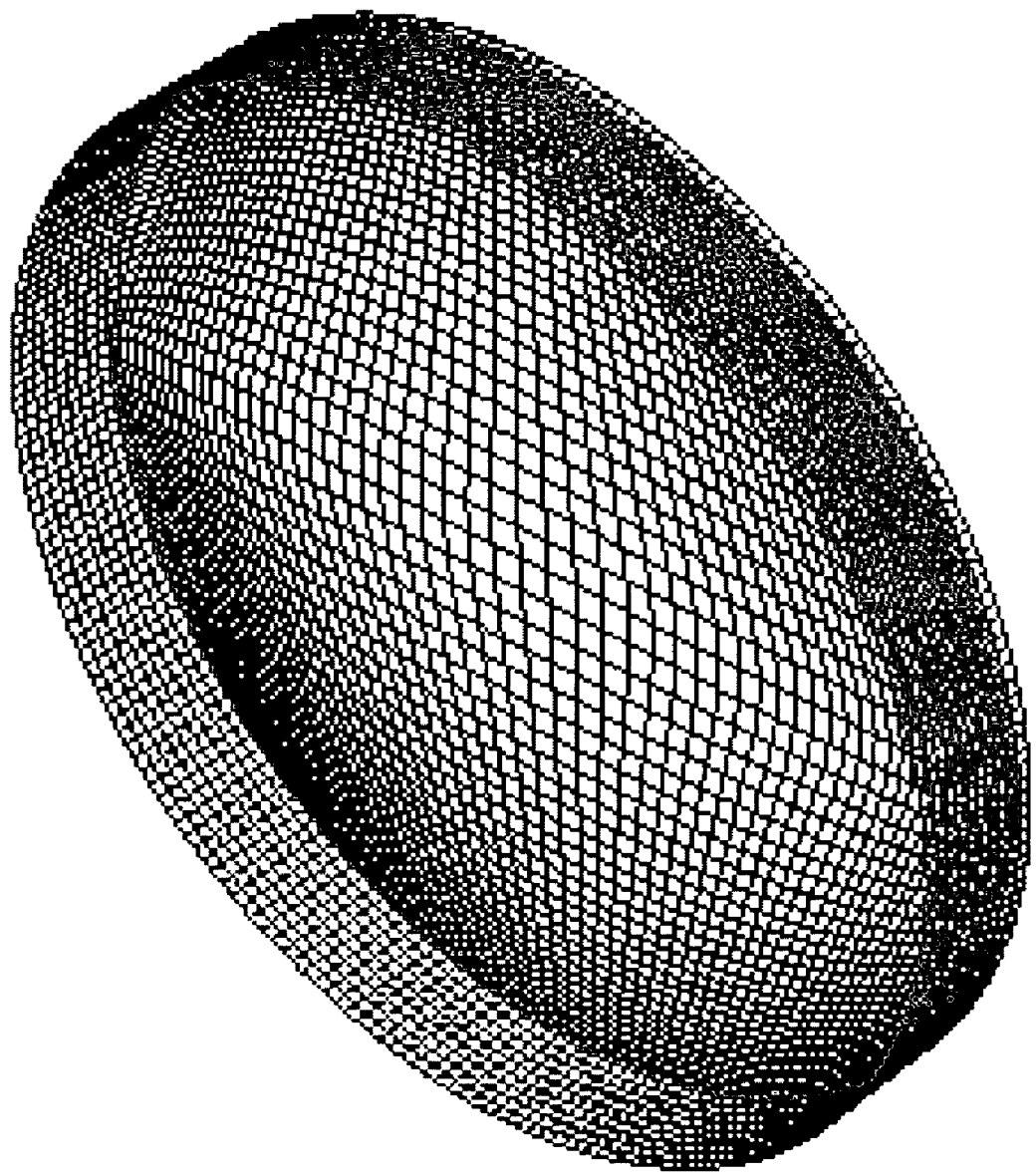
FIG. 8B is a perspective view of the grid of FIG. 8A.

FIG. 8A is a 61×61 grid of a cross-sectional view of a representative 61×61×11 grid at any axial station of a thin solid disk for use with an embodiment of the invention. The three-dimensional grid for FIG. 8A has a 61×61 grid and 11 points along the axial direction. FIG. 8B is a perspective view of the grid of FIG. 8A.

Rotating Thin Gear

Figure 9:
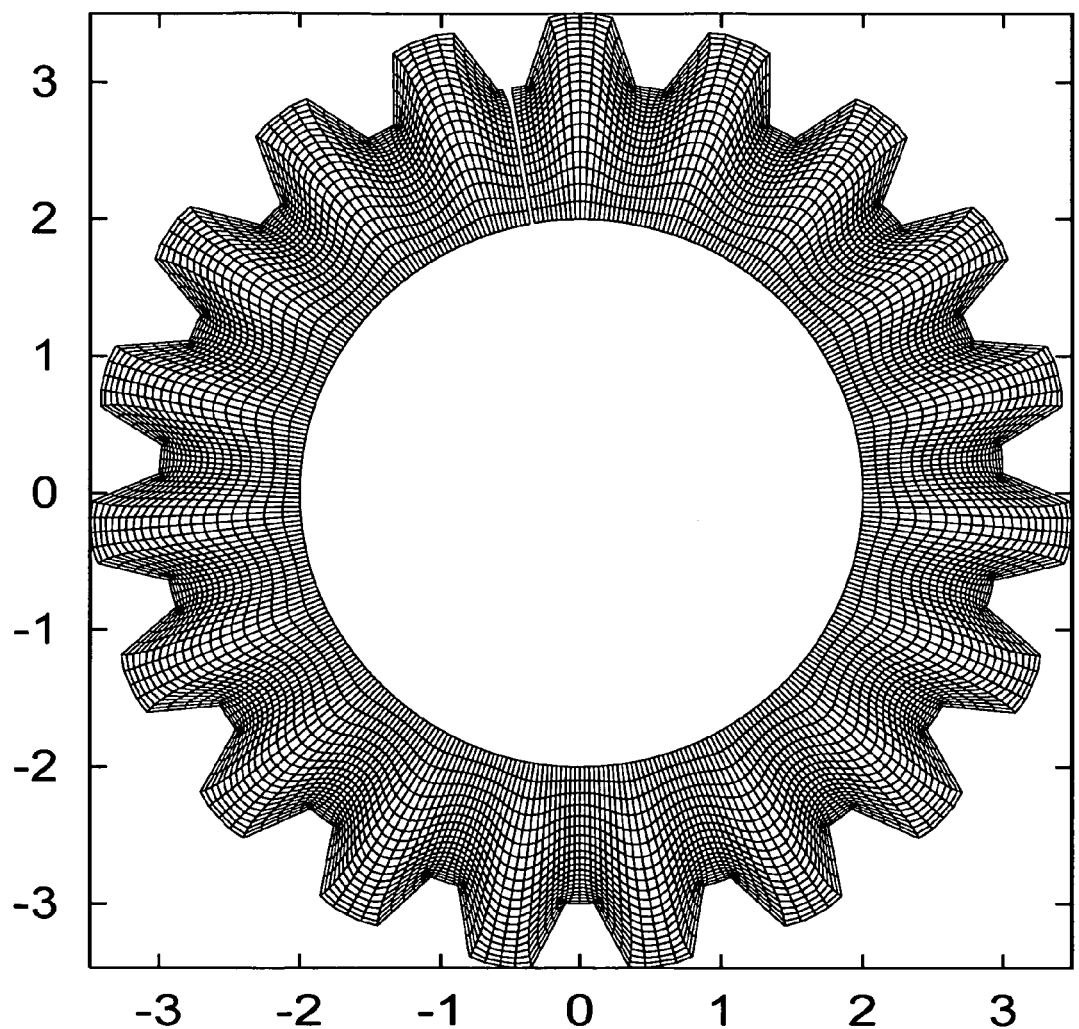
FIG. 9 is a cross-sectional view of a representative three-dimensional grid of an idealized gear for use with an embodiment of the invention.
Figure 10A:
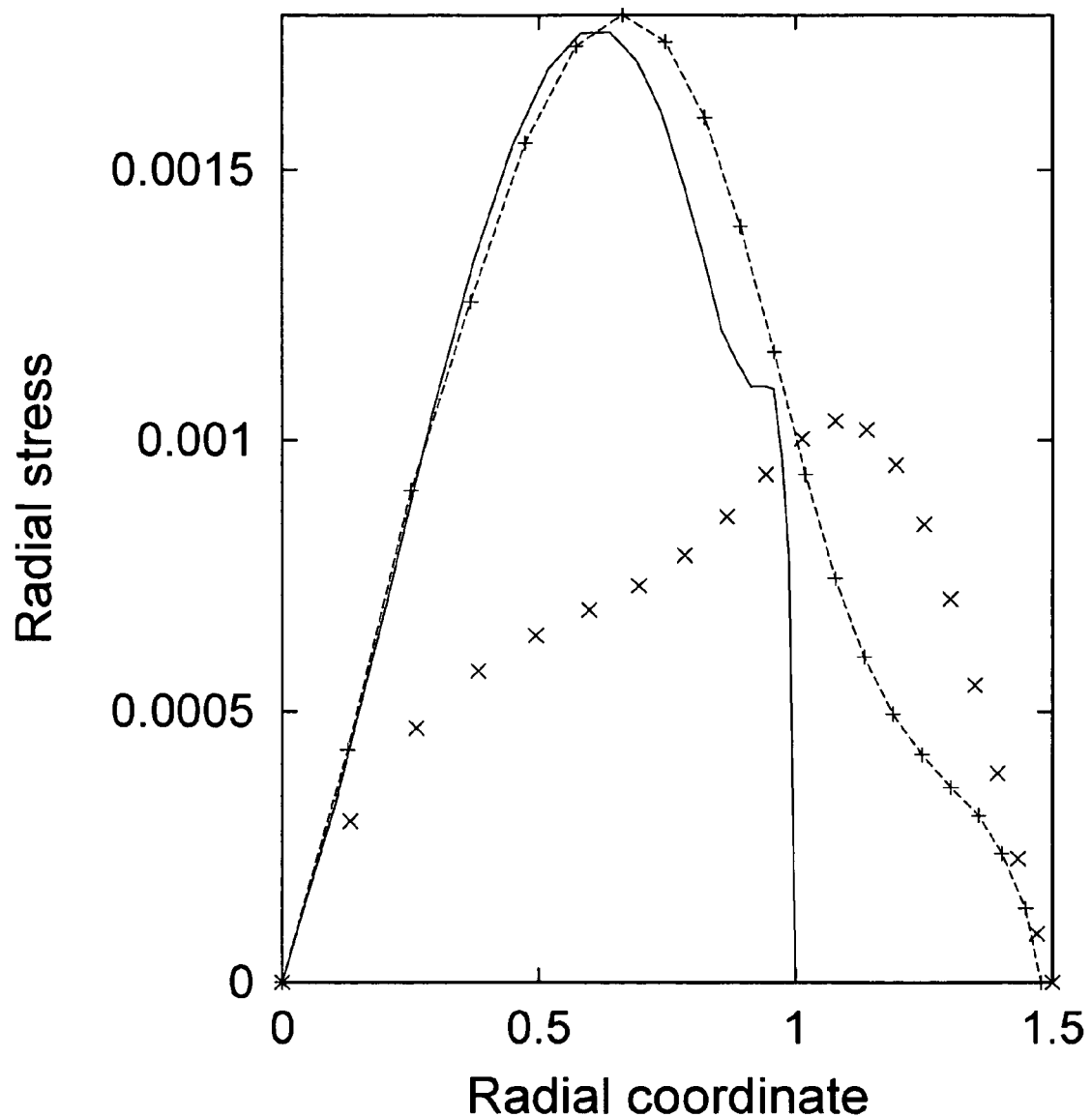
FIGS. 10A-10B are plots of radial stress distributions along three "radial" lines of the idealized gear of FIG. 9.
Figure 10B:
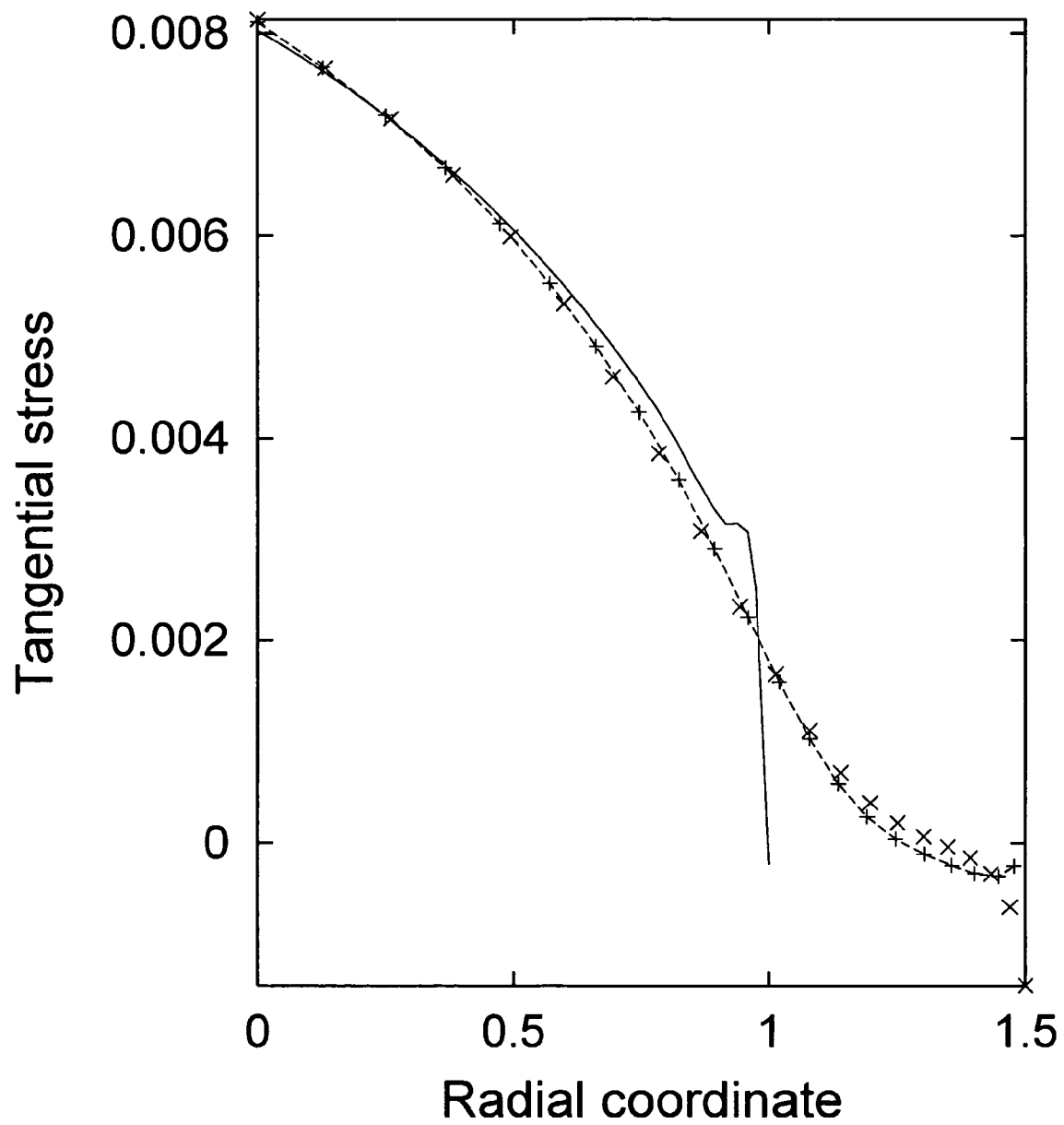

FIG. 9 is a cross-sectional grid of a 19-tooth gear for use with an embodiment of the invention. In the case of a gear, there is no theoretical solution available. Since the predictions have been validated for the annular geometries as discussed above, results for a thin 19-tooth gear are presented here as a realistic application. There are some annulus solution characteristics present in the gear predictions, as shown in the following figures. FIG. 10A shows a comparison among radial stress distributions along three "radial" lines, first one joining the inner radius with one end of the tooth at the base represented by a solid line, the second one between the inner radius and the top end of the tooth represented by a solid line with crosses, and the third one between the inner radius and the top middle point on the tooth. Similarly, FIG. 10B shows the comparison among the three tangential stress distributions along these three "radial" lines. The stresses along the "radial" lines joining the inner radius and the top middle point on the tooth look similar to the results for the annulus.

A physics based first principles approach is adopted to model and simulate vibration signatures from an idealized gear such as a thin spur gear of the type represented by FIG. 9. The governing equations are solved using a finite-difference approach as described above. The velocity-stress form of elastodynamic partial differential equations as used in earthquake signature modeling has been used here with the essential difference that in the present case, the velocity-stress system is solved in generalized curvilinear coordinates and the system being essentially dynamic entails the prescription of generalized characteristic boundary conditions based on the theory of hyperbolic systems; thus, artificial wave reflection and wave attenuation problems are totally eliminated. The vibration signatures are thus directly obtained in the time domain. A second-order accurate in time and space time-staggered leap-frog scheme is used to integrate the time-dependent partial differential equations. Idealized signatures, normal as well as damage vibration signatures, ensuing from an impulsive rotation of the gear are obtained and compared; normal signature is taken to be the one correspondent with homogeneous material properties throughout the domain. Damage signatures correspond to a case where the rigidity of one of the gear teeth is locally reduced. It is observed that significant deviations from the normal signature occur in amplitude and phase due to this damage. Using this approach, baseline or reference signatures can be obtained for any structural subsystem which can be used to calibrate and validate various damage detection algorithms for such systems.

Normal vibrations of an idealized multi-teeth steel gear are simulated by impulsively rotating the gear. This throws the gear into free vibrations about an equilibrium state that would be attained by it, if it had been set into rotation gradually from an initial state of rest. After about four rotations, the gear attains this steady state.

The simulation considered corresponds to all the gear teeth except one, labeled tooth #1, having uniform material properties as those of industrial steel. The shear modulus or the rigidity of tooth #1 is decreased in a certain fashion over the region shown in FIG. 11. This is just to mimic a damage state that would yield distinctly different vibration signatures from this particular tooth from those from the rest of the gear teeth. The gear is impulsively rotated at 6,000 rpm. The elastodynamic partial differential equations (pde), three for the velocity vector and six for the symmetric stress tensor, are integrated in time, using fully characteristic boundary conditions as disclosed herein. An attractive element of the characteristic boundary condition approach is that the artificial wave attenuation and wave reflection problems associated with the traditional boundary condition approach are entirely eliminated. The velocity-stress form of the elastodynamic pde has been used in geophysics to predict reference earthquake signatures. The integration is carried out until the end of the fourth rotation of the gear, when the vibrations have essentially died out and the equilibrium stress state is achieved. Thus the steady-state solution is obtained for radial, tangential and shear stress distribution all over the gear in constant rotation at 6,000 rpm. No grid independence study has been performed for this embodiment. But, having conducted the grid independence study using the present methodology for other geometries described above, the accuracy of the results presented here is believed to be adequate in the present context. Also, as noted above, a small measure of Coriolis effect may be present even at 6,000 rpm during the dynamic state of the gear.

Figure 11:
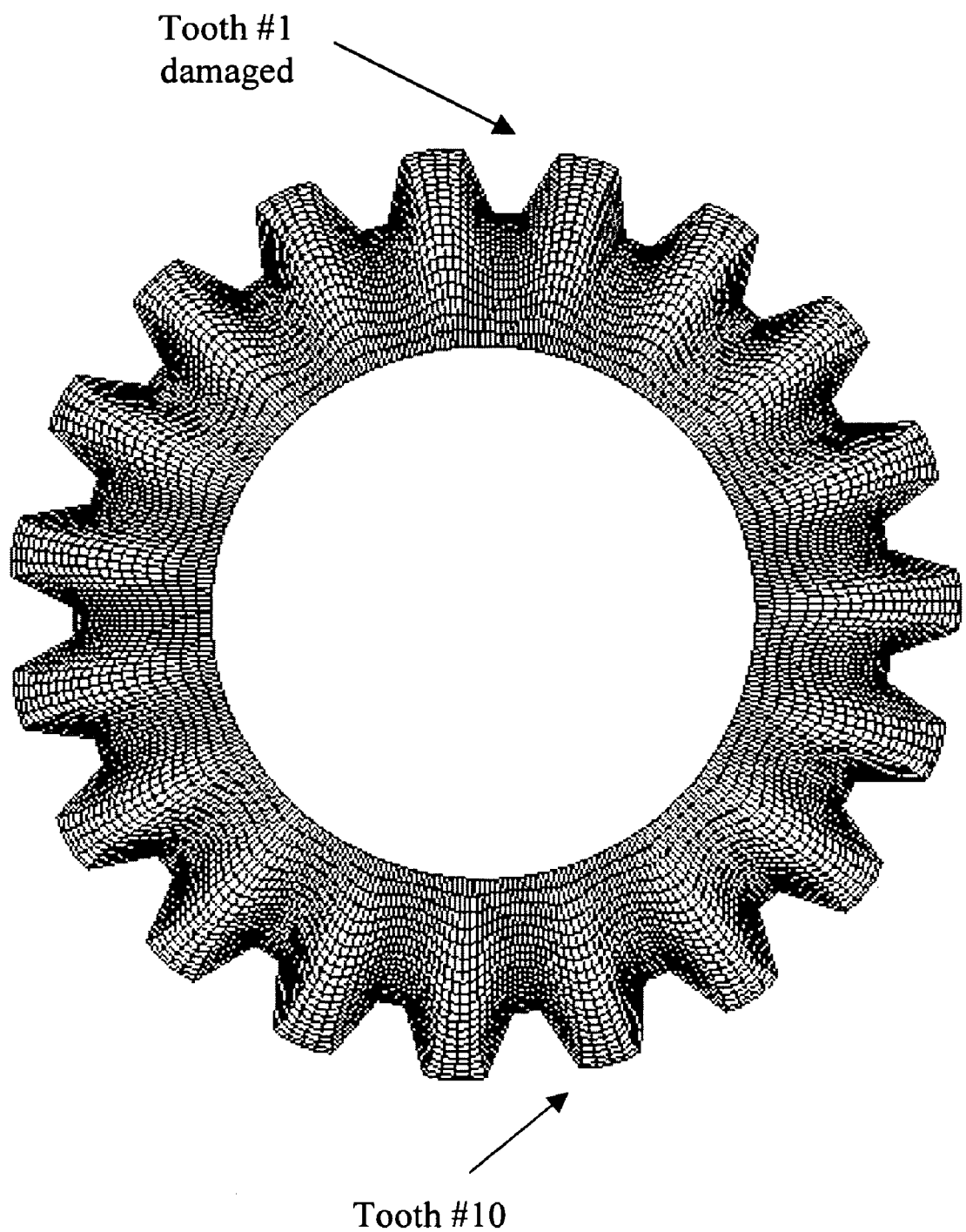
FIG. 11 is a cross-sectional view of a representative three-dimensional grid of an idealized gear for use with an embodiment of the invention and having a tooth region with reduced rigidity.
Figure 12A:
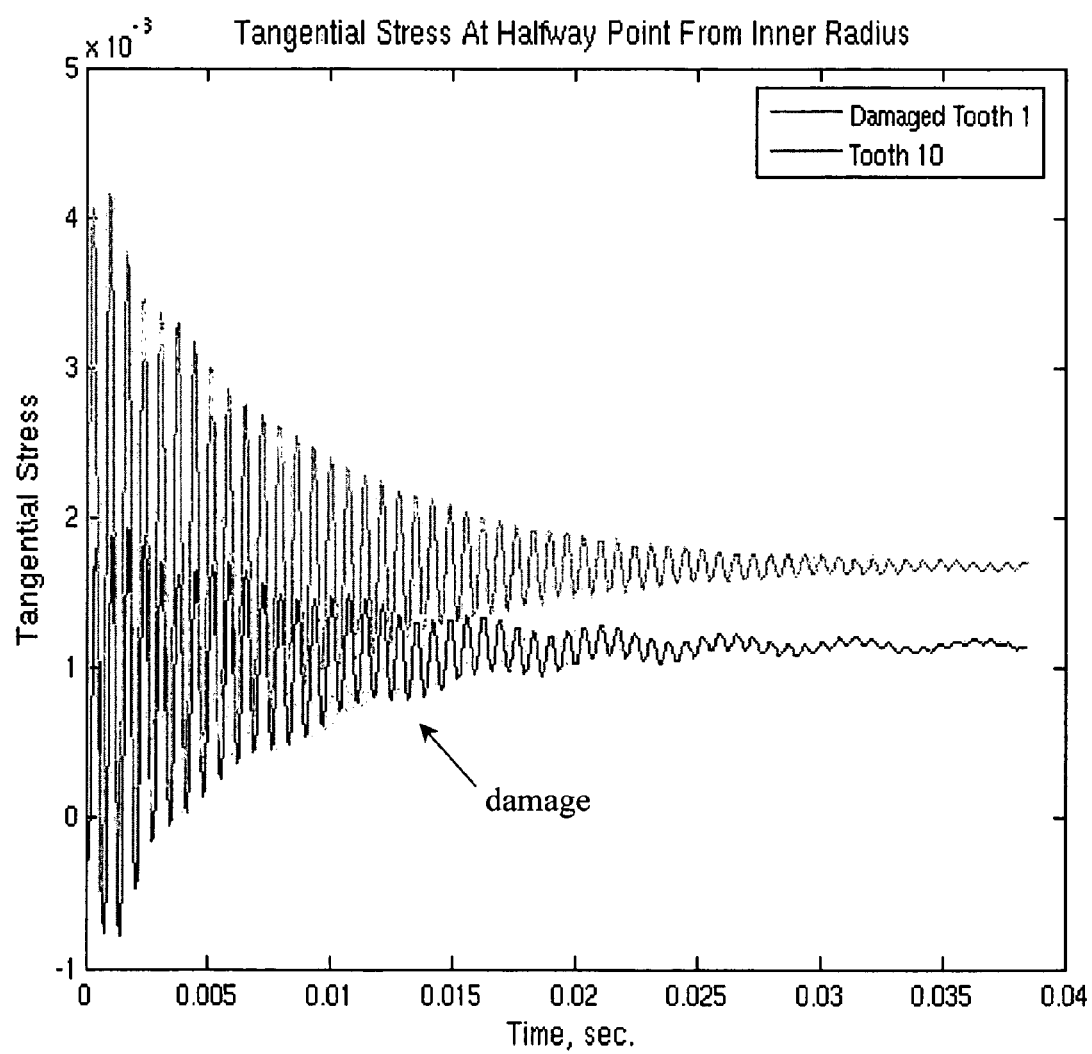
FIGS. 12A-12C are plots of tangential stress signatures over time at various locations between the inner radius and outer radius at corresponding locations below a damaged tooth and a normal tooth of the idealized gear of FIG. 11.
Figure 12B:
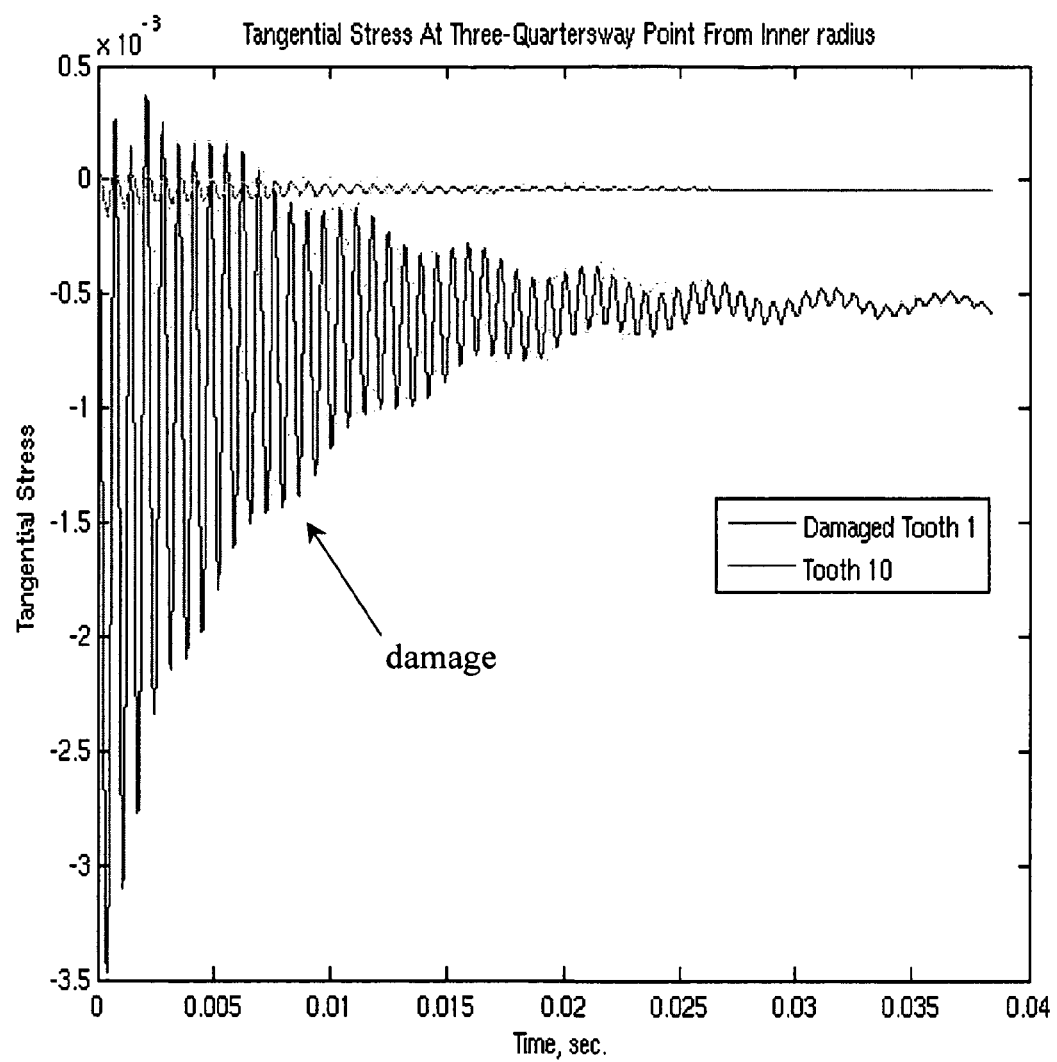
Figure 12C:
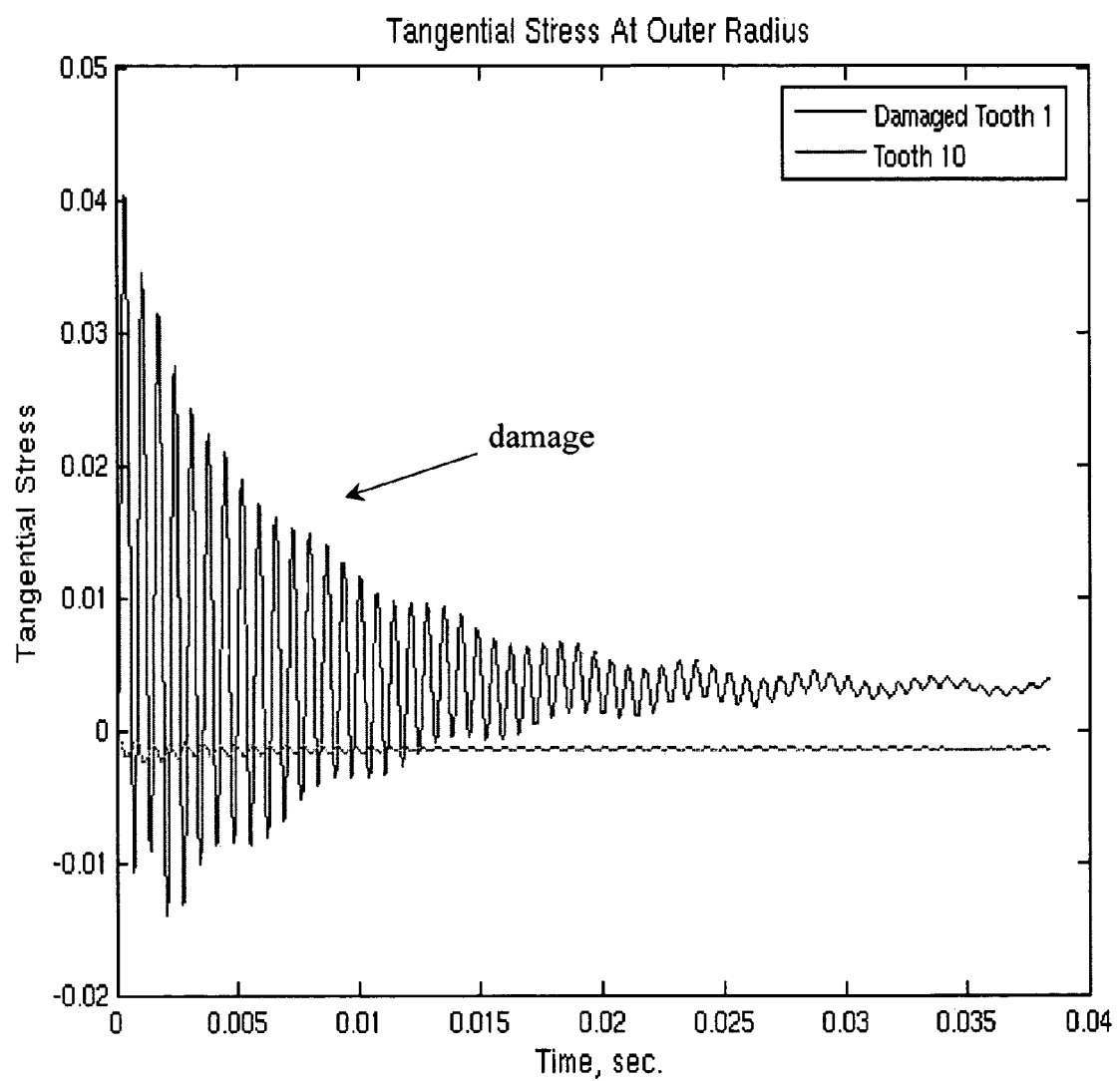
Figure 13A:
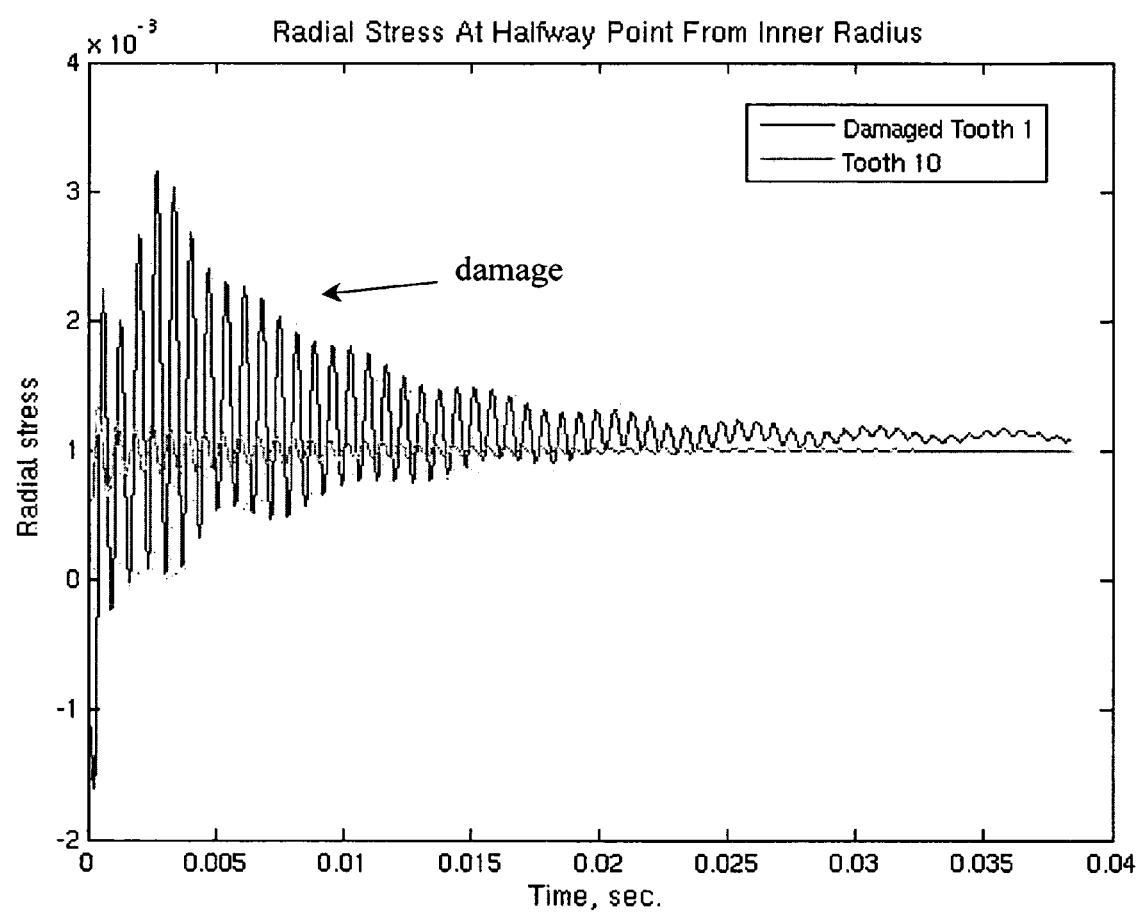
FIGS. 13A-13B are plots of radial stress signatures over time at various locations between the inner radius and outer radius at corresponding locations below a damaged tooth and a normal tooth of the idealized gear of FIG. 11.
Figure 13B:
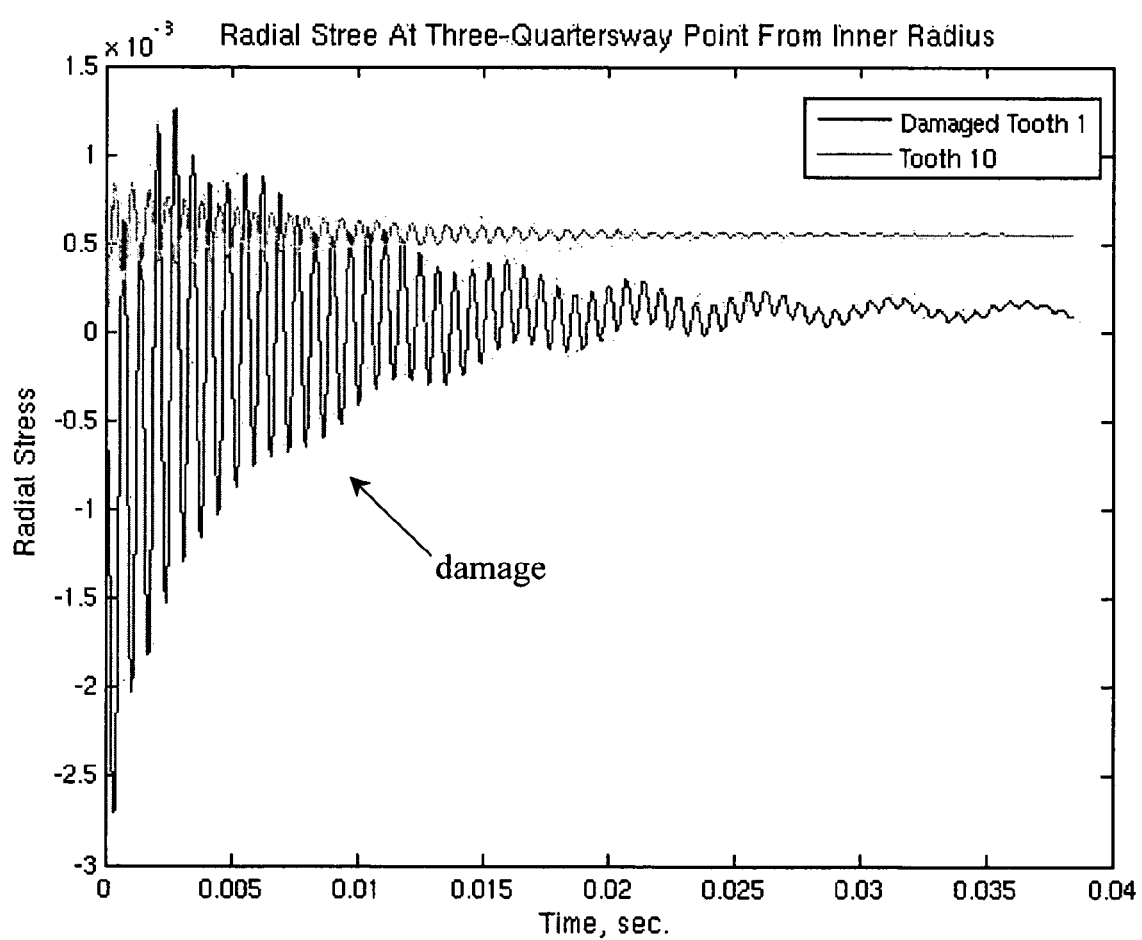
Figure 14A:
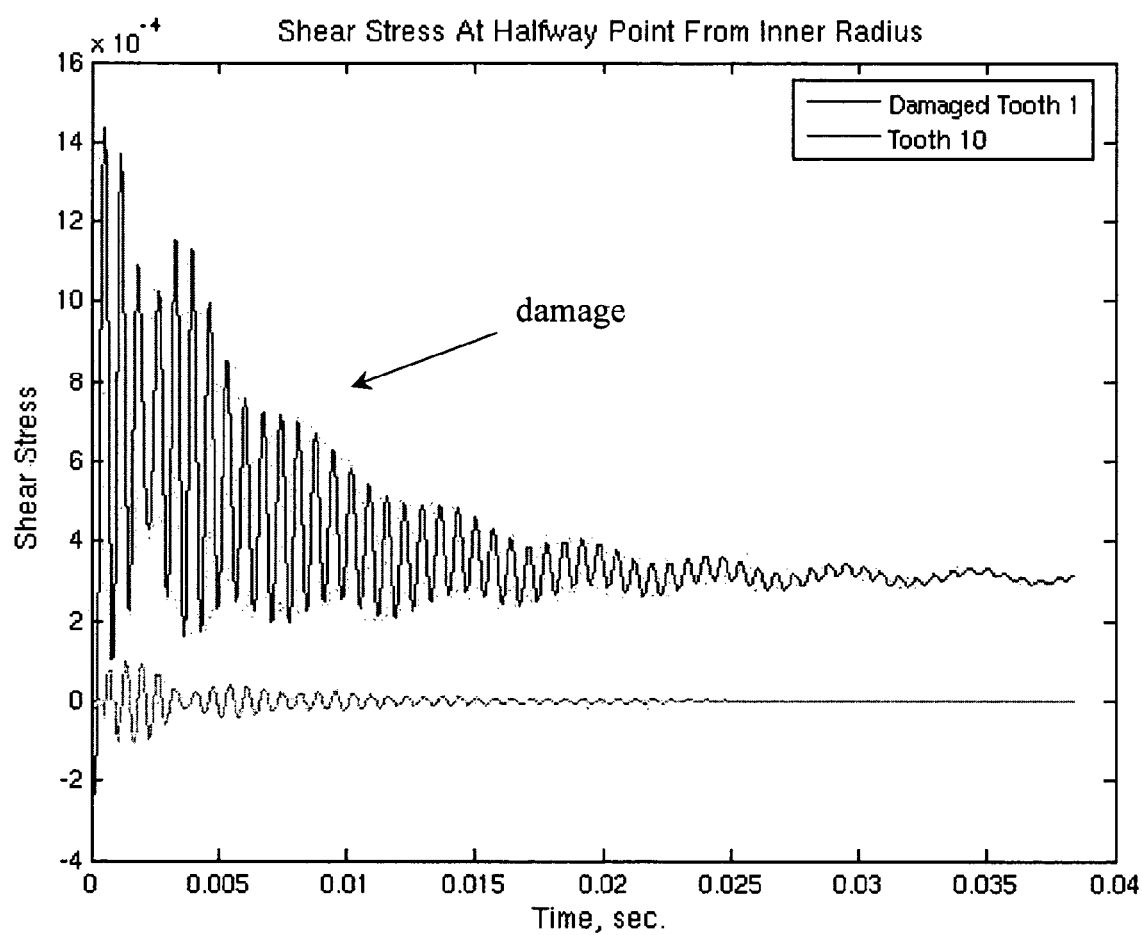
FIGS. 14A-14B are plots of shear stress signatures over time at various locations between the inner radius and outer radius at corresponding locations below a damaged tooth and a normal tooth of the idealized gear of FIG. 11.
Figure 14B:
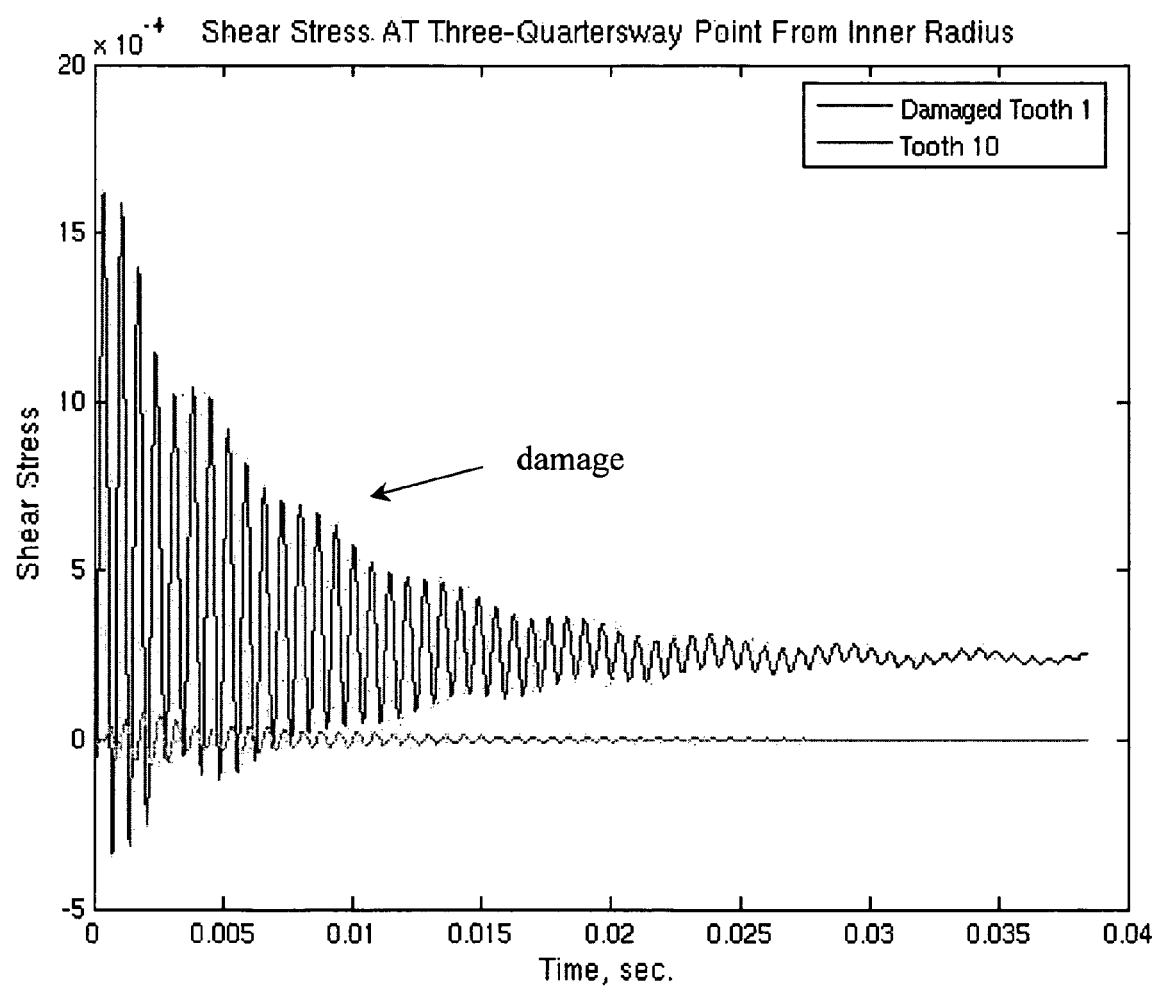
Figure 15:
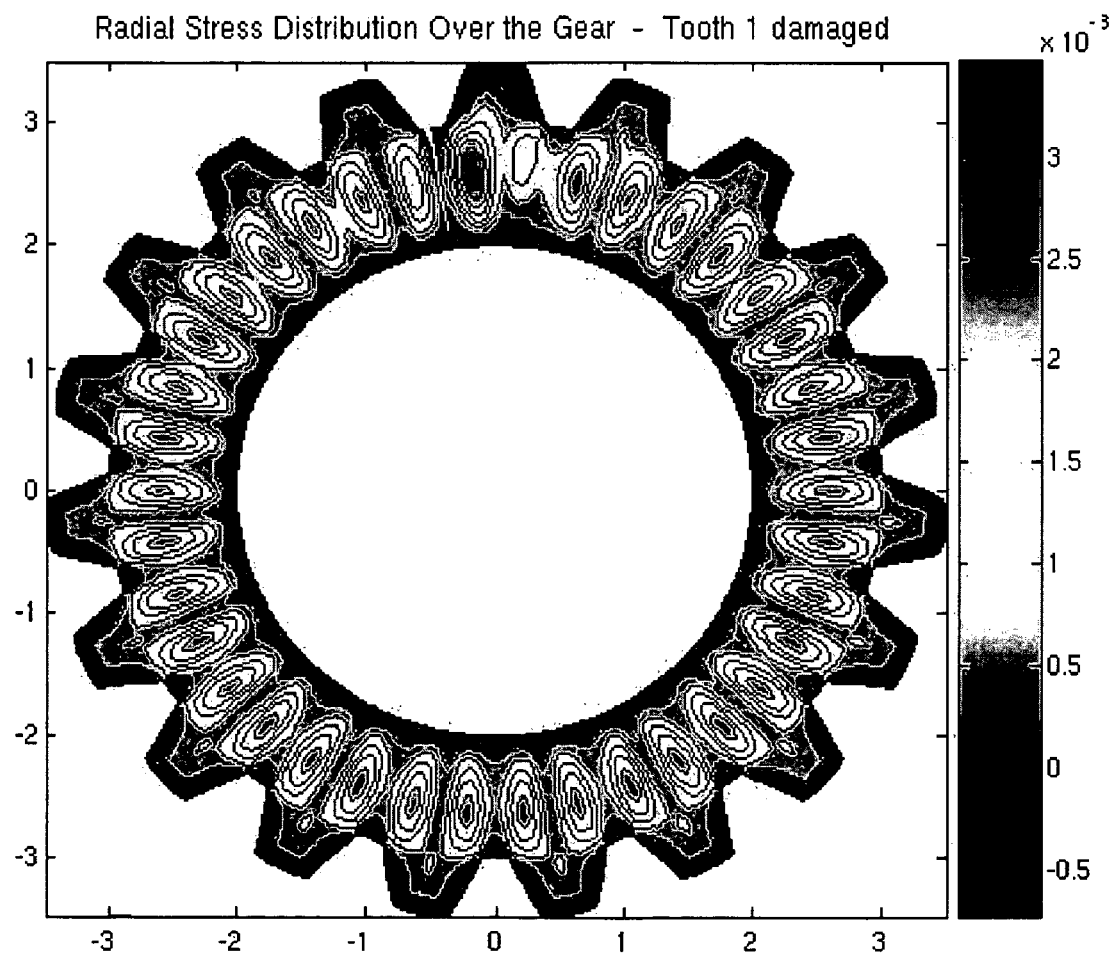
FIG. 15 is a plot of steady-state radial stress distribution of the idealized gear of FIG. 11.

The results from the simulation are compared side by side in terms of the time evolution of radial, tangential and shear stresses at selected locations on two selected gear teeth, tooth #1 and tooth #10, as shown in FIGS. 12A-12C, 13A-13B and 14A-14B. Also shown is the steady state distribution of radial stress, all over the gear, with the damage tooth #1, in FIG. 15. The radial and tangential directions in the present case correspond to the two orthogonal generalized curvilinear coordinates, as shown in FIG. 11.

Figure 16:
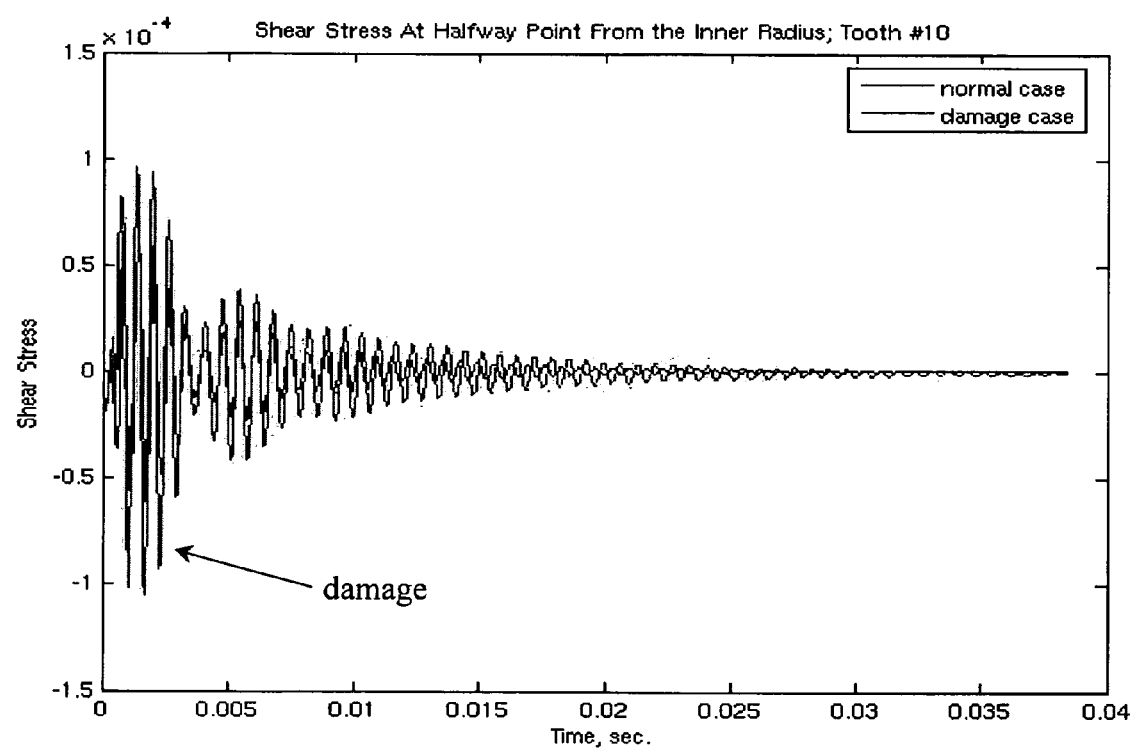
FIG. 16 is a plot showing a comparison between normal and damage shear stress vibration signatures midway between the inner and outer radii at tooth #10 of the idealized gear of FIG. 11.

A comparison of signatures from the damaged tooth #1 and a normal tooth #10 demonstrates that they vary significantly from each other. Also, certain insights can be drawn from simulations such as the present one that would aid in better design technologies of such systems. For example, as shown in FIG. 16, a comparison of time signatures of shear stresses corresponding to two cases, one where all the teeth are normal and the other where tooth #1 is damaged, reveals that the signal (shear stress wave) from the damaged tooth #1 reaches tooth #10 in about 0.3 millisecond, subsequent to an impulsive rotation.

These simulations can be used in conjunction with damage detection algorithms such as wavelets and machine learning methods for isolation, diagnosis and prognosis of system damage states. Such structural damage, amongst others, can be caused by unwanted material property variation due to thermal effects or manufacturing faults, sudden impact and repetitive loading, during the system operation. A wide variety of these physics-based simulations could be carried out to compute various forms of normal and damage signatures. These signatures could then be used as reference signatures to calibrate and validate various damage detection algorithms

CONCLUSION

A new three-dimensional formulation in generalized curvilinear coordinates for the velocity-stress elastic system has been presented for a finite-difference solution over two and three-dimensional axisymmetric geometries as well as a general two-dimensional gear geometry. The axisymmetric predictions are validated by comparing them with steady-state axisymmetrical analytical solutions. Steady-state as well as unsteady predictions are also made for a thin multi-tooth gear. The various embodiments can be used to generate time-dependent stress data corresponding to a variety of boundary conditions on a variety of dynamical systems such as a rotating gear simulating a gear pair in mesh, a rocket motor geometry and the space shuttle orbiter wing leading edge subjected to external dynamical loading. These numerically generated vibrations data can, in turn, be used to characterize different vibration states that the system may pass through.

It is understood that the various embodiments may be performed by a processor in response to computer-readable instructions stored on a computer-usable medium, such as a fixed or removable storage media. Results may be presented to a user in any of a variety of formats, such as tabular, graphical or animation through the use of an appropriate user interface. Such computer systems are well understood.

Although specific embodiments have been illustrated and described herein, it will be appreciated by those of ordinary skill in the art that any arrangement that is calculated to achieve the same purpose may be substituted for the specific embodiments described. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A computer implemented method of simulating time-dependent stress data for a structural system, the method comprising:
   generating, using a computer system, an elliptic grid representative of a geometry of the structural system, the grid comprising a plurality of grid cells;
   solving, using the computer system, a three dimensional Finite Difference Model of elastodynamic partial differential equations having velocity components and stress components in generalized curvilinear coordinates over each grid cell of the elliptic grid;
   updating, using the computer system, the geometry of the structural system in response to solving the elastodynamic partial differential equations;
   generating, using the computer system, a revised elliptic grid representative of the updated geometry of the structural system; and
   animating, using the computer system, a solution of the elastodynamic partial differential equations in time as the simulation proceeds.

2. The method of claim 1, wherein solving the elastodynamic partial differential equations further comprises solving, using the computer system, the equations directly in the time domain.

3. The method of claim 1, further comprising:
   introducing, using the computer system, a fault into the elliptic grid and allowing the fault to propagate in time while alternating solving the equations and generating revised elliptic grids.

4. The method of claim 1, wherein the partial differential equations in generalized curvilinear coordinates, $(\xi, \eta, \zeta, \epsilon)$ in flux-conservative form are given by:

$$\partial_\epsilon(A/J)$$

$$\partial_\xi[(A/J)\xi_t-(1/J)(\xi_x B+\xi_y C+\xi_z D)]$$

$$+\partial_\eta[(A/J)\eta_t-(1/J)(\eta_x B+\eta_y C+\eta_z D)]$$

$$+\partial_\zeta[(A/J)\zeta_t-(1/J)(\zeta_x B+\zeta_y C+\zeta_z D)]=R/J$$

where R is a right hand side column vector containing centrifugal and Coriolis terms associated with the rotating frame of reference and, additionally, terms containing spatial derivatives of the elastic constants for non-homogeneous bodies, and J is the Jacobian of coordinate transformation, $\partial(x,y,z)/\partial(\xi,\eta,\zeta)$ where $\partial$ is the partial derivative with respect to the particular generalized coordinate variable $\xi, \eta, \zeta$; $\epsilon$ is the time coordinate in the generalized coordinate space and where the metric quantities $\xi_t, \xi_x$, etc. have their usual meanings. The left hand side vectors are given by $$A=[\rho u, \rho v, \rho w, \tau_{xx}, \tau_{yx}, \tau_{xz}, \tau_{yy}, \tau_{yz}, \tau_{zz}]^T$$

$$B=[\tau_{xx}, \tau_{xy}, \tau_{xz}, (\lambda+2\mu)u, \mu v, \mu w, \lambda u, 0, \lambda u]^T$$

$$C=[\tau_{xy}, \tau_{yy}, \tau_{yz}, \lambda v, \mu u, 0, (\lambda+2\mu)v, \mu w, \lambda v]^T$$

$$D=[\tau_{xz}, \tau_{yz}, \tau_{zz}, \lambda w, 0\mu u, \lambda w, \mu v, (\lambda+2\mu)w]^T$$

where $\rho$ is the material density of the structural medium; u, v, w are the three velocity components $\tau_{ij}$ are the 6 components of the symmetric stress tensor; $\lambda$ and $\mu$ are the Lame constants. A is the solution vector, and B, C and D are the flux vectors Nomenclature
  J=Jacobian of coordinate transformation
  R=right hand side vector
  u,v,w=velocity components
  x,y,z, t=Cartesian coordinates and the time coordinate
  $\lambda, \mu$=Lame constants
  $\rho$=material density
  $\tau$=symmetric stress tensor
  $\xi, \eta, \zeta, \epsilon$=generalized curvilinear coordinates and time coordinate
Subscript
  i, j, k=indices for coordinate directions
Superscript
  T=vector transpose.

5. The method of claim 1, further comprising:
   generating, using the computer system, stress boundary conditions for the partial differential equations in generalized curvilinear coordinates from a second order tensor transformation from a Cartesian coordinate system.

6. The method of claim 1, wherein solving the elastodynamic partial differential equations further comprises integrating, using the computer system, the velocity and stress components of the equations using a second-order accurate in time and space, time-staggered leap frog method.

7. The method of claim 1, further comprising:
   generating, using the computer system, vibration signatures from the time-dependent forcing functions.

8. The method of claim 1, wherein the step of solving the three dimensional Finite Difference Model of elastodynamic partial differential equations includes solving, using the computer system, a set of nine elastodynamic partial differential equations, three partial differential equations for the three velocity components and six partial differential equations for the six stress tensor components.

9. A computer implemented method of designing a structural system comprising:
   generating, using a computer system, an elliptic grid representative of a geometry of the structural system, the grid comprising a plurality of grid cells;
   solving, using the computer system, a three dimensional Finite Difference Model of elastodynamic partial differential equations having velocity components and stress components in generalized curvilinear coordinates over each grid cell of the elliptic grid;

identifying, using the computer system, areas of local maxima of stress directly at any given time in response to solving the elastodynamic partial differential equations; and modifying, using the computer system, the design of the structural system in response to identifying the areas of local maxima of stress.

10. The method of claim 9, wherein modifying the design of the structural system in response to identifying the areas of local maxima of stress further comprises identifying, using the computer system, locations for sensor placement on the structural system corresponding to the areas of local maxima of stress for health monitoring of the structural system.

11. The method of claim 9, further comprising:

animating, using the computer system, a solution of the elastodynamic partial differential equations in time as the method proceeds.

12. The method of claim 9, wherein solving the elastodynamic partial differential equations further comprises solving, using the computer system, the equations directly in the time domain.

13. The method of claim 9, wherein solving the elastodynamic partial differential equations further comprises integrating, using the computer system, the velocity and stress components of the equations using a second-order accurate in time and space, time-staggered leap frog method.

14. The method of claim 9, wherein solving the three dimensional Finite Difference Model of elastodynamic partial differential equations includes solving, using the computer system, a set of nine elastodynamic partial differential equations, three elastodynamic partial differential equations for the three velocity components and six elastodynamic partial differential equations for the six stress tensor components.

15. A computer implemented method of monitoring the health of a structural system, the method comprising:

generating, using a computer system, an elliptic grid representative of a geometry of the structural system, the grid comprising a plurality of grid cells;

solving, using the computer system, a three dimensional Finite Difference Model of elastodynamic partial differential equations having velocity components and stress components in generalized curvilinear coordinates over each grid cell of the elliptic grid;

generating, using the computer system, reference vibration signature corresponding to a given portion of the structural system in response to solving the elastodynamic partial differential equations; and comparing, using the computer system, the reference vibration signature corresponding to the given portion of the structural system to a predicted vibration signature of the given portion of the structural system by a machine learning method;

displaying, using the computer system, the reference vibration signature and the measured vibration signature in real time during the operation of the structural system; and dynamically assessing, using the computer system, the health of the structural system by quantifying the deviation of the measured vibration signature from the reference vibration signature directly in real time during the operation of the structural system.

16. The method of claim 15, wherein solving the elastodynamic partial differential equations further comprises solving, using the computer system, the equations directly in the time domain.

17. The method of claim 15, further comprising:

generating, using the computer system, stress boundary conditions for the partial differential equations in generalized curvilinear coordinates from a second order tensor transformation from a Cartesian coordinate system.

18. The method of claim 15, wherein solving the elastodynamic partial differential equations further comprises integrating, using the computer system, the velocity and stress components of the equations using a second-order accurate in time and space, time-staggered leap frog method.

19. The method of claim 15, wherein solving the three dimensional Finite Difference Model of elastodynamic partial differential equations includes solving, using the computer system, a set of nine elastodynamic partial differential equations, three elastodynamic partial differential equations for the three velocity components and six elastodynamic partial differential equations for the six stress tensor components.

20. The method of claim 15, wherein the reference vibration signature is a reference displacement signature and the measured vibration signature is a measured displacement signature.

21. The method of claim 15, wherein the reference vibration signature is a reference acceleration signature and the measured vibration signature is a measured acceleration signature.

22. The method of claim 15, wherein the reference vibration signature is a reference stress signature and the measured vibration signature is a measured stress signature.

23. A computer readable storage medium storing computer executable instructions which when executed on a computer to perform a method of simulating time-dependent stress data for a structural system, the medium comprising instructions for:

generating an elliptic grid representative of a geometry of the structural system, the grid comprising a plurality of grid cells;

solving a three dimensional Finite Difference Model of a set of nine elastodynamic partial differential equations having, three elastodynamic partial differential equations for the three velocity components and six elastodynamic partial differential equations for the six stress tensor components in generalized curvilinear coordinates over each grid cell of the elliptic grid;

updating the geometry of the structural system in response to solving the elastodynamic partial differential equations;

automatically generating in dynamic simulation time a revised elliptic grid representative of the updated geometry of the structural system; and animating, using the computer system, a solution of the elastodynamic partial differential equations in time as the simulation proceeds.

24. A computer implemented method of designing a structural health monitoring system that monitors the health of the structural system during its operation, comprising:

generating, using a computer system, an elliptic grid representative of a geometry of the structural system, the grid comprising a plurality of grid cells;

solving, using the computer system, a three dimensional Finite Difference Model of elastodynamic partial differential equations having velocity components and stress components in generalized curvilinear coordinates over each grid cell of the elliptic grid;

identifying, using the computer system, areas of local maxima of stress directly at any given time in response to solving the elastodynamic partial differential equations;

identifying, using the computer system, locations for sensor placement corresponding to the areas of local maxima of stress for health monitoring of the structural system; and comparing, using the computer system, stress data from the sensors with the three dimensional stress solution by using machine learning methodology;

displaying, using the computer system, the three dimensional stress solution and the stress data from the sensors in real time during the operation of the structural system; and determining, using the computer system, if operation of the structural system is safe or if the structural system is about to fail.

* * * * *